(12) United States Patent
Kanakamedala et al.

(10) Patent No.: US 11,244,953 B2
(45) Date of Patent: Feb. 8, 2022

(54) THREE-DIMENSIONAL MEMORY DEVICE INCLUDING MOLYBDENUM WORD LINES AND METAL OXIDE SPACERS AND METHOD OF MAKING THE SAME

(71) Applicant: SANDISK TECHNOLOGIES LLC, Addison, TX (US)

(72) Inventors: Senaka Kanakamedala, San Jose, CA (US); Raghuveer S. Makala, Campbell, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 163 days.

(21) Appl. No.: 16/801,456

(22) Filed: Feb. 26, 2020

(65) Prior Publication Data
US 2021/0265372 A1    Aug. 26, 2021

(51) Int. Cl.
| *H01L 27/11582* | (2017.01) |
| *H01L 27/11556* | (2017.01) |
| *H01L 27/11519* | (2017.01) |
| *H01L 23/532* | (2006.01) |
| *H01L 27/11565* | (2017.01) |

(52) U.S. Cl.
CPC .. *H01L 27/11556* (2013.01); *H01L 23/53257* (2013.01); *H01L 27/11519* (2013.01); *H01L 27/11565* (2013.01); *H01L 27/11582* (2013.01)

(58) Field of Classification Search
CPC .................. H01L 27/11582; H01L 27/11578
See application file for complete search history.

(56) References Cited

U.S. PATENT DOCUMENTS

| 5,915,167 A | 6/1999 | Leedy |
| 8,847,302 B2 | 9/2014 | Alsmeier et al. |
| | (Continued) | |

FOREIGN PATENT DOCUMENTS

| JP | 10-20190113192 A | 10/2019 |
| WO | WO2019046030 A1 | 3/2019 |

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Christopher A Johnson
(74) *Attorney, Agent, or Firm* — The Marbury Law Group PLLC

(57) ABSTRACT

A three-dimensional memory device includes an alternating stack of insulating layers and word lines that are made of molybdenum layers located over a substrate, and memory stack structures extending through each layer in the alternating stack. Each of the memory stack structures includes a memory film and a vertical semiconductor channel contacting an inner sidewall of the memory film. Each memory film includes a vertical stack of discrete tubular dielectric metal oxide spacers in contact with a respective one of the molybdenum layers, a continuous silicon oxide blocking dielectric layer contacting an inner sidewall of each of the tubular dielectric metal oxide spacers, a vertical stack of charge storage material portions, and a tunneling dielectric layer contacting each of the charge storage material portions and the vertical semiconductor channel.

13 Claims, 27 Drawing Sheets

(56) References Cited

U.S. PATENT DOCUMENTS

| | | |
|---|---|---|
| 9,230,974 B1 | 1/2016 | Pachamuthu et al. |
| 9,230,979 B1 | 1/2016 | Pachamuthu et al. |
| 9,305,937 B1 | 4/2016 | Tsutsumi et al. |
| 9,478,558 B2 | 10/2016 | Koka et al. |
| 9,613,977 B2 | 4/2017 | Sharangpani et al. |
| 9,659,955 B1 | 5/2017 | Sharangpani et al. |
| 9,659,956 B1 | 5/2017 | Pachamuthu et al. |
| 9,780,182 B2 | 10/2017 | Peri et al. |
| 9,875,929 B1 | 1/2018 | Shukla et al. |
| 9,984,963 B2 | 5/2018 | Peri et al. |
| 9,991,277 B1 | 6/2018 | Tsutsumi et al. |
| 10,256,247 B1 | 4/2019 | Kanakamedala et al. |
| 10,283,513 B1 | 5/2019 | Zhou et al. |
| 10,290,648 B1 | 5/2019 | Zhou et al. |
| 10,290,650 B1 | 5/2019 | Iwai |
| 10,438,964 B2 | 10/2019 | Makala et al. |
| 10,516,025 B1 | 12/2019 | Nishikawa et al. |
| 10,529,620 B2 | 1/2020 | Sharangpani et al. |
| 2008/0284719 A1 | 11/2008 | Yoshida |
| 2008/0284768 A1 | 11/2008 | Yoshida et al. |
| 2008/0284929 A1 | 11/2008 | Kimura |
| 2012/0249907 A1 | 10/2012 | Kimura |
| 2014/0313444 A1 | 10/2014 | Kimura |
| 2014/0339624 A1 | 11/2014 | Ramaswamy |
| 2014/0367762 A1 | 12/2014 | Tian et al. |
| 2015/0318300 A1 | 11/2015 | Ohsaki |
| 2015/0338709 A1 | 11/2015 | Yoshida |
| 2015/0380432 A1 | 12/2015 | Ramaswamy |
| 2016/0070148 A1 | 3/2016 | Kimura |
| 2016/0111439 A1 | 4/2016 | Tsutsumi et al. |
| 2016/0149002 A1 | 5/2016 | Sharangpani et al. |
| 2016/0163725 A1 | 6/2016 | Kamiya et al. |
| 2016/0211272 A1 | 7/2016 | Koka et al. |
| 2016/0225866 A1 | 8/2016 | Peri et al. |
| 2016/0300847 A1 | 10/2016 | Manorotkul et al. |
| 2016/0351497 A1 | 12/2016 | Peri et al. |
| 2016/0379989 A1 | 12/2016 | Sharangpani et al. |
| 2017/0125436 A1 | 5/2017 | Sharangpani et al. |
| 2017/0179026 A1 | 6/2017 | Toyama et al. |
| 2017/0179151 A1 | 6/2017 | Kai et al. |
| 2017/0179152 A1 | 6/2017 | Toyama et al. |
| 2017/0179153 A1 | 6/2017 | Ogawa et al. |
| 2017/0179154 A1 | 6/2017 | Furihata et al. |
| 2017/0235197 A1 | 8/2017 | Kimura |
| 2017/0352669 A1 | 12/2017 | Sharangpani et al. |
| 2017/0352678 A1 | 12/2017 | Lu et al. |
| 2017/0373197 A1 | 12/2017 | Sharangpani et al. |
| 2018/0090373 A1 | 3/2018 | Sharangpani et al. |
| 2018/0151588 A1 | 5/2018 | Tsutsumi et al. |
| 2018/0197876 A1 | 7/2018 | Ge et al. |
| 2018/0267373 A1 | 9/2018 | Yoshida |
| 2018/0315771 A1 | 11/2018 | Sandhu et al. |
| 2018/0350825 A1 | 12/2018 | Ogawa et al. |
| 2018/0364531 A1 | 12/2018 | Kimura |
| 2018/0374866 A1 | 12/2018 | Makala et al. |
| 2019/0139973 A1 | 5/2019 | Zhou et al. |
| 2019/0148392 A1 | 5/2019 | Kanno et al. |
| 2019/0148506 A1 | 5/2019 | Kanakamedala et al. |
| 2019/0280001 A1 | 9/2019 | Terasawa et al. |
| 2019/0355845 A1 | 11/2019 | Zhou et al. |
| 2019/0386108 A1 | 12/2019 | Nishikawa et al. |
| 2020/0006375 A1 | 1/2020 | Zhou et al. |
| 2020/0006376 A1 | 1/2020 | Makala et al. |
| 2020/0020715 A1 | 1/2020 | Nakamura et al. |
| 2020/0051993 A1 | 2/2020 | Rabkin et al. |
| 2020/0058672 A1 | 2/2020 | Nishikawa et al. |
| 2020/0127126 A1* | 4/2020 | Lee ................. H01L 29/7889 |

OTHER PUBLICATIONS

Tsubouchi, K. et al., "Selective Aluminum Chemical Vapor Deposition," Journal of Vacuum Science & Technology, vol. A 10, No. 4, pp. 856-862, (1992); htps.//doi.org/10.1116.1.577664.

U.S. Appl. No. 16/272,468, filed Feb. 11, 2019, SanDisk Technologies LLC.

U.S. Appl. No. 16/278,426, filed Feb. 18, 2019, SanDisk Technologies LLC.

U.S. Appl. No. 16/278,488, filed Feb. 18, 2019, SanDisk Technologies LLC.

U.S. Appl. No. 16/362,857, filed Mar. 25, 2019, SanDisk Technologies LLC.

U.S. Appl. No. 16/362,895, filed Mar. 25, 2019, SanDisk Technologies LLC.

U.S. Appl. No. 16/441,439, filed Jun. 14, 2019, SanDisk Technologies LLC.

U.S. Appl. No. 16/582,262, filed Sep. 25, 2019, SanDisk Technologies LLC.

Notification of Transmittal of the International Search Report and Written Opinion of the International Search Authority for International Patent Application No. PCT/US2020/036568, dated Nov. 23, 2020, 14 pages.

* cited by examiner

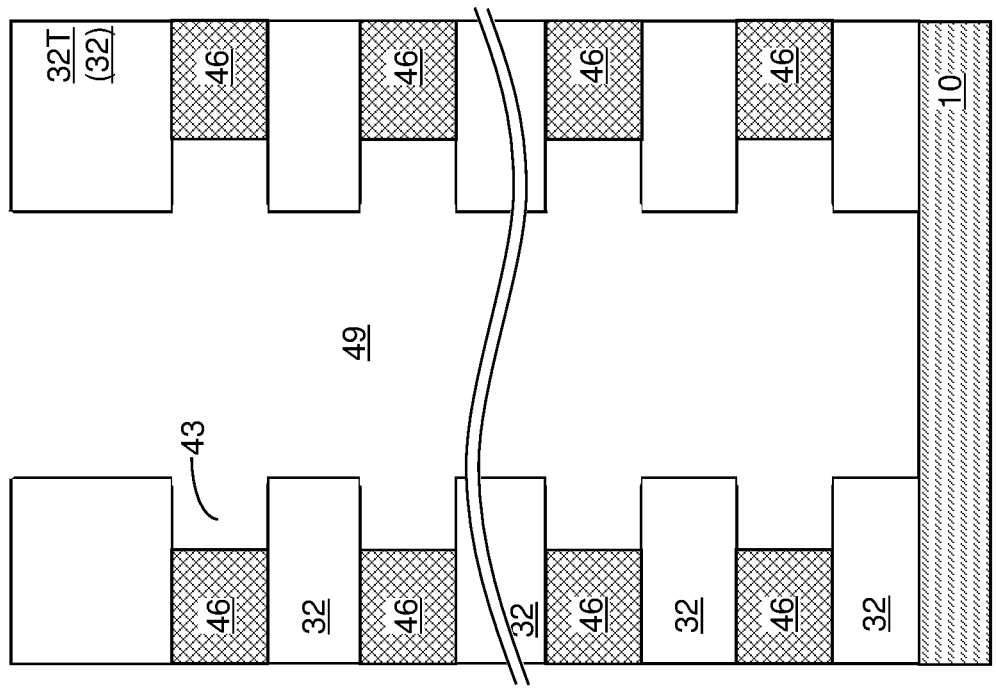
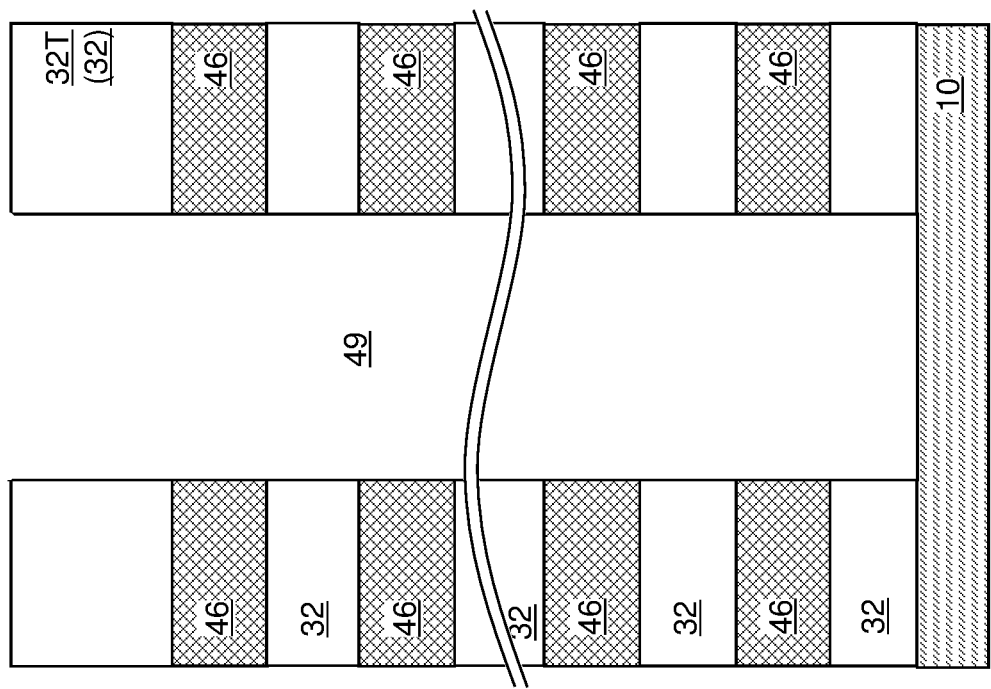

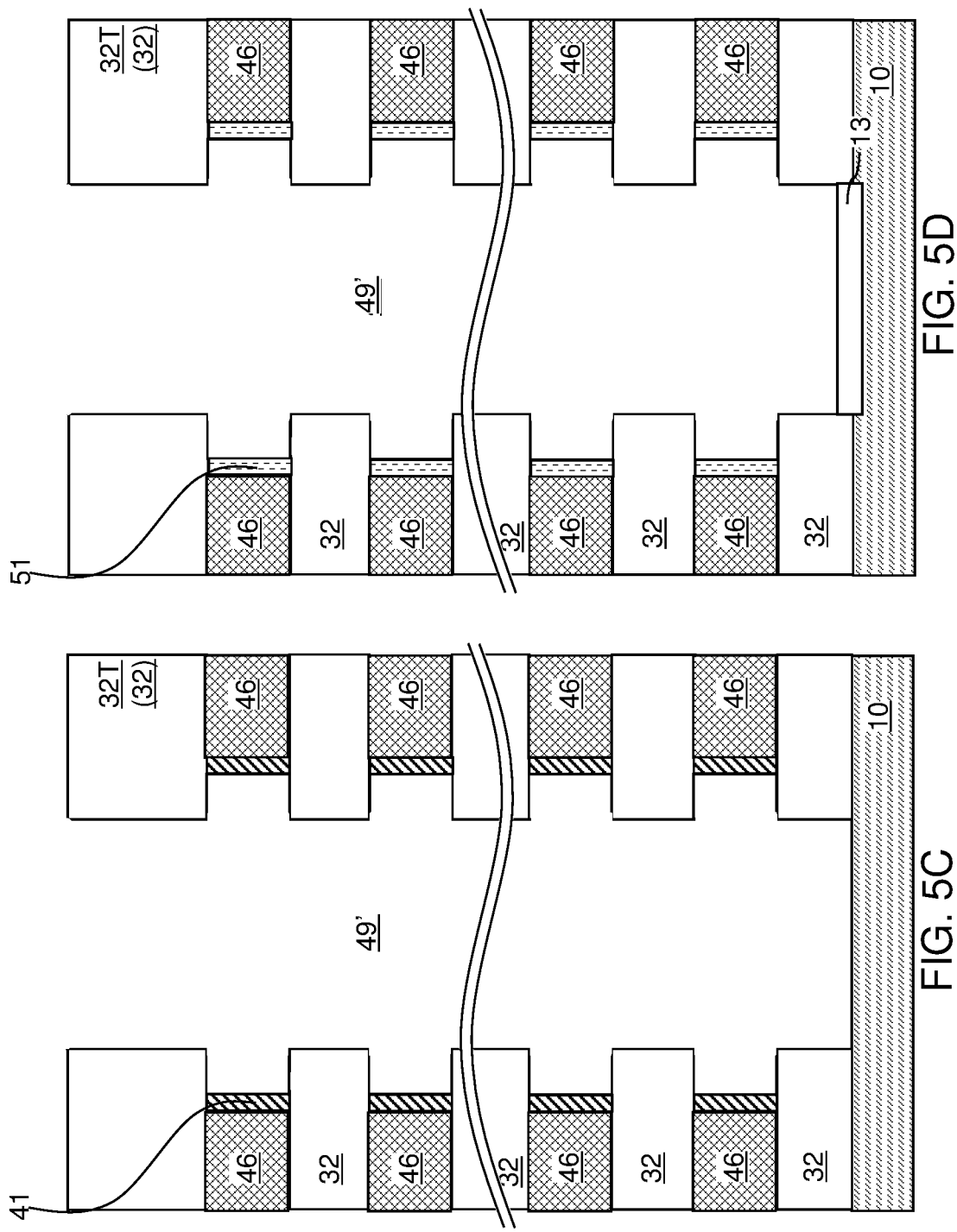

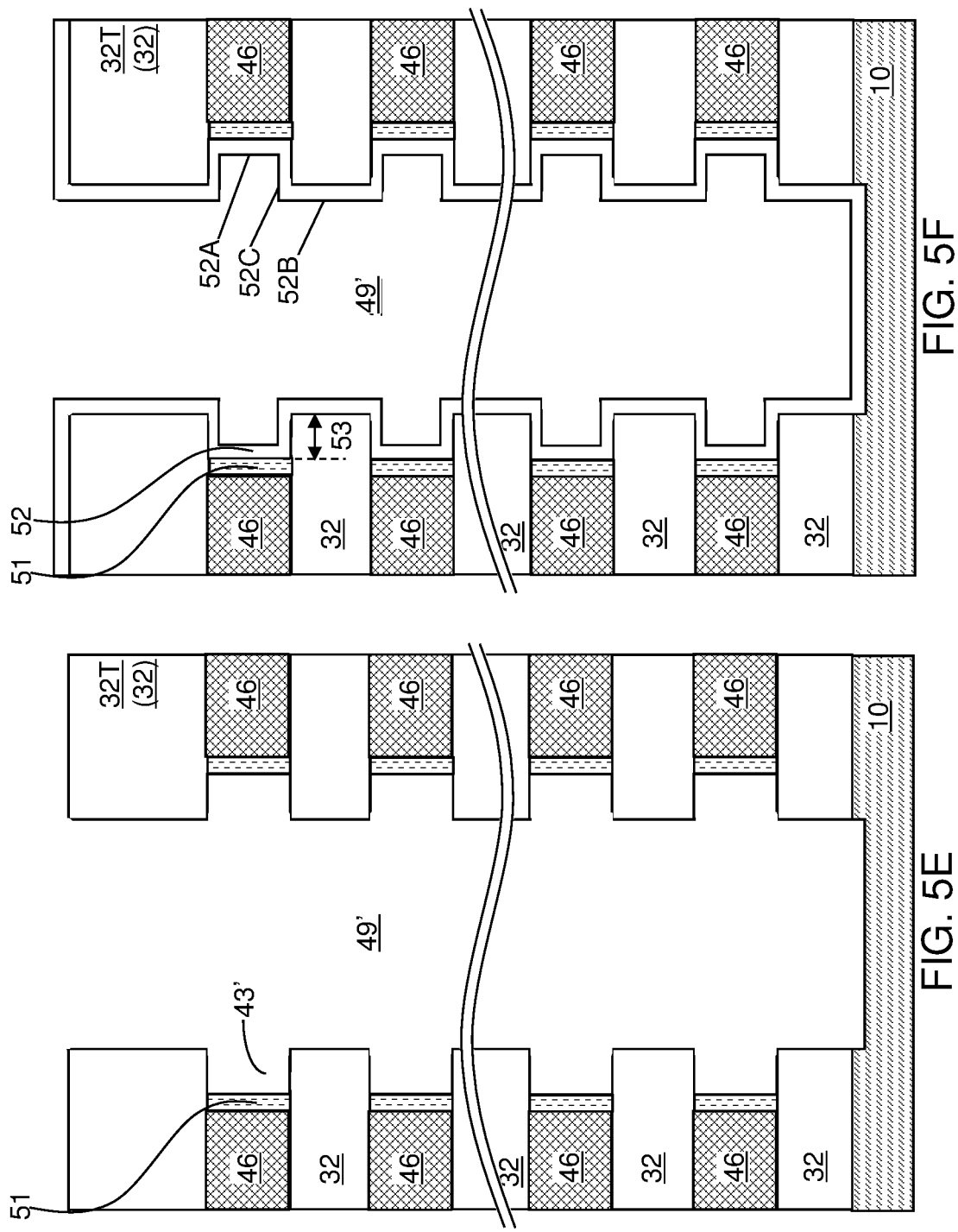

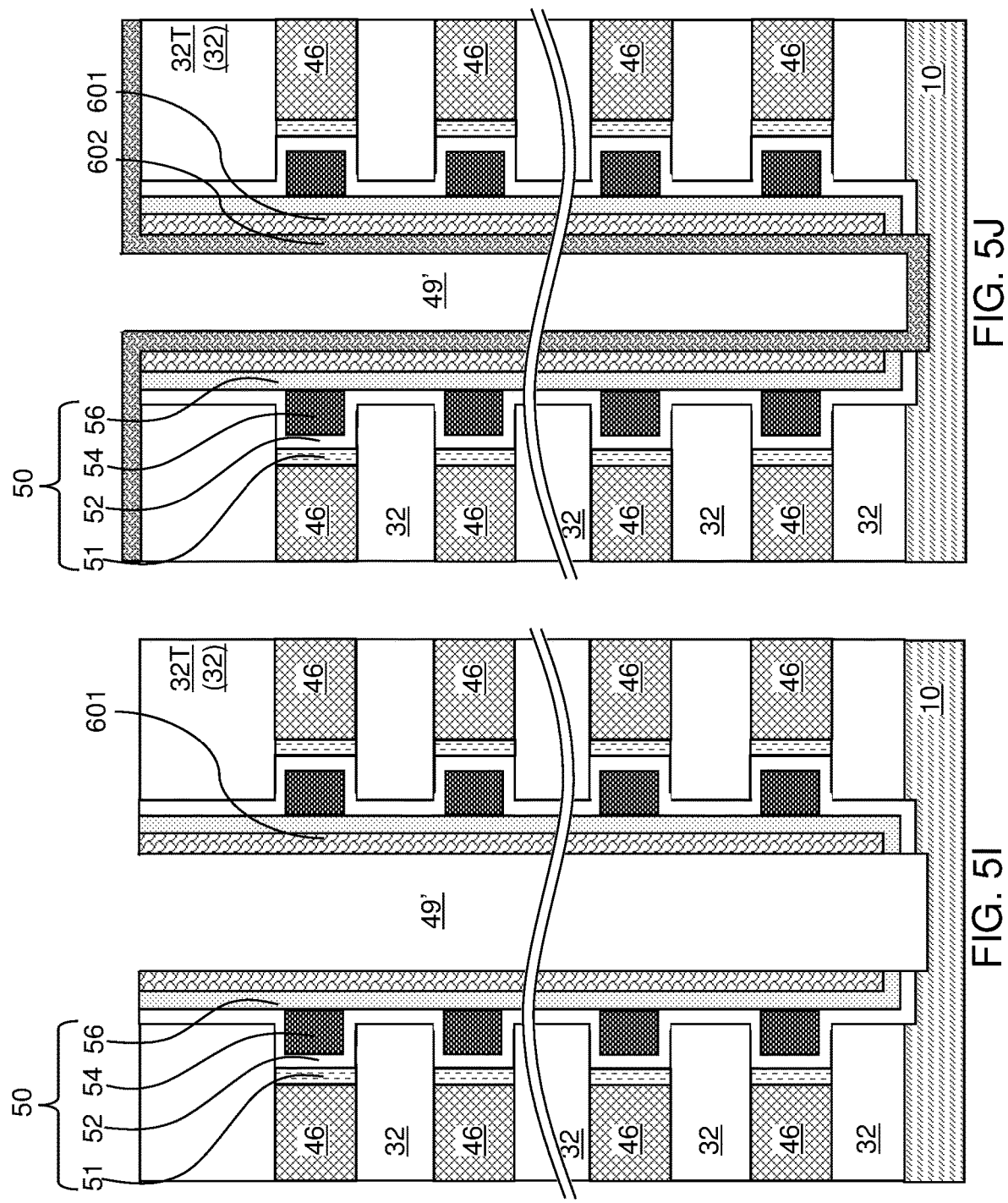

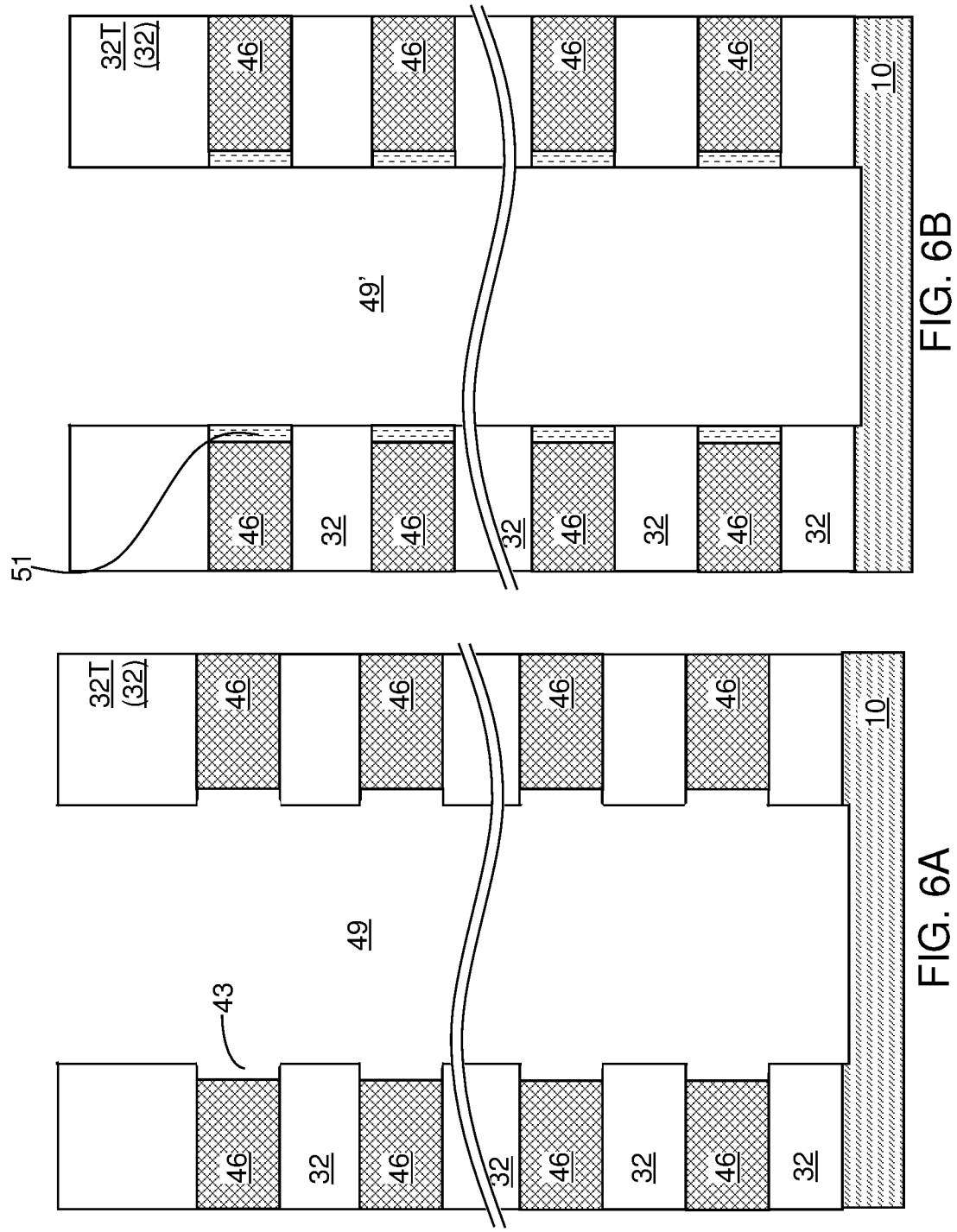

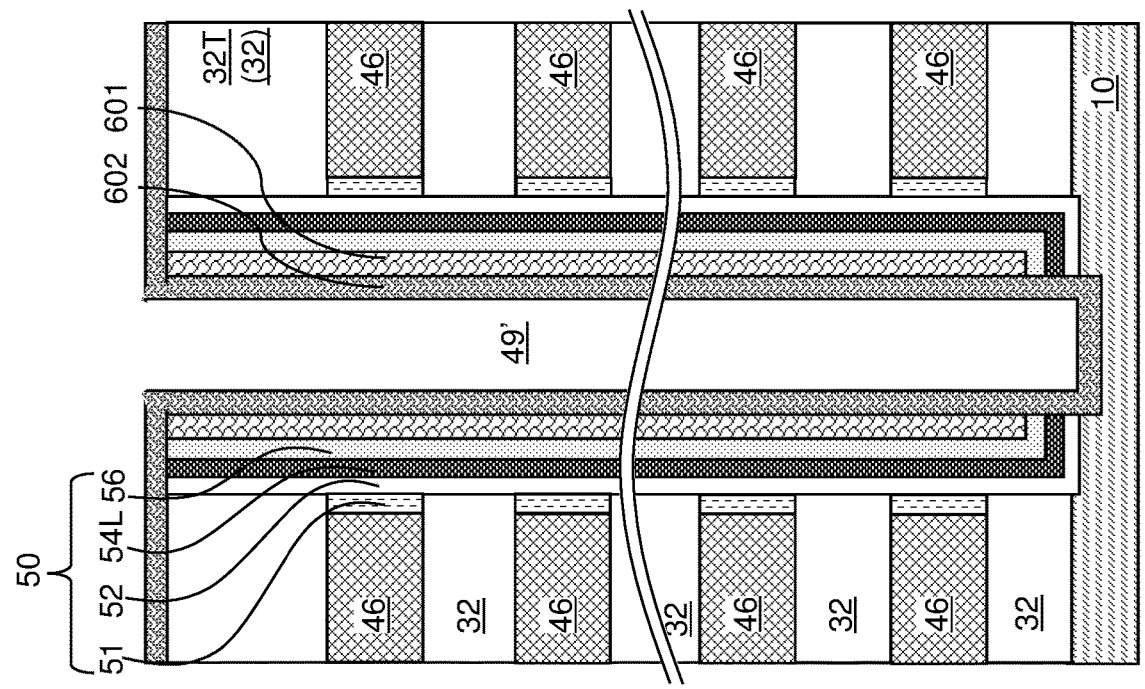
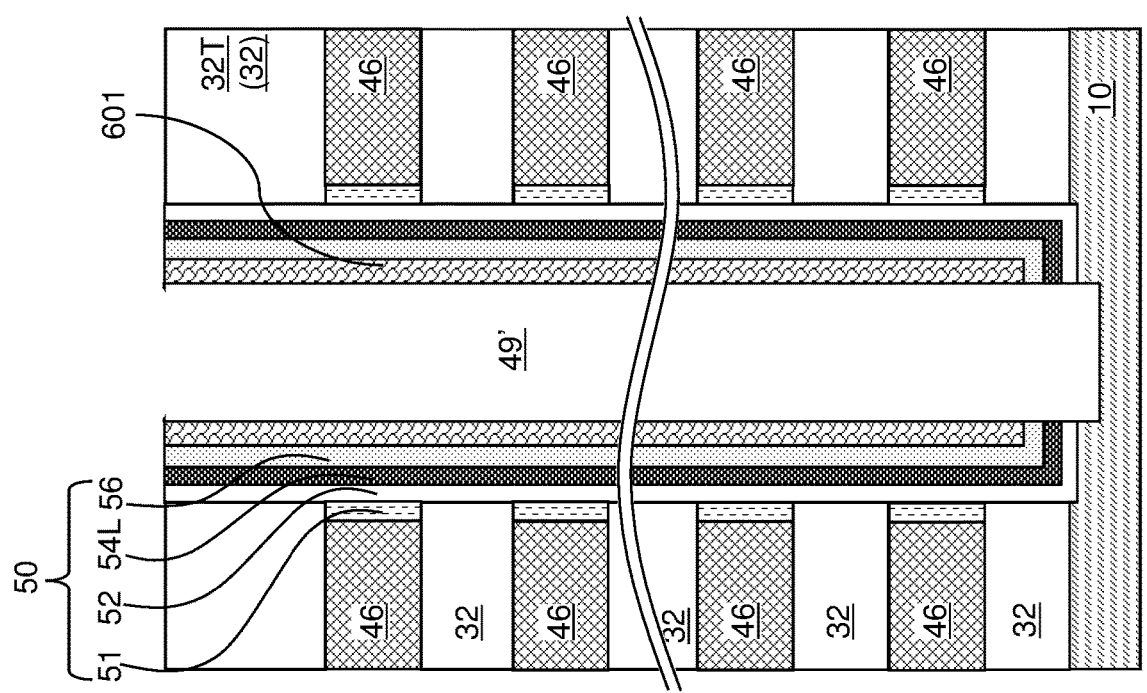
FIG. 6E
FIG. 6F

THREE-DIMENSIONAL MEMORY DEVICE INCLUDING MOLYBDENUM WORD LINES AND METAL OXIDE SPACERS AND METHOD OF MAKING THE SAME

FIELD

The present disclosure relates generally to the field of semiconductor devices, and particularly to a three-dimensional memory device including molybdenum word lines and self-aligned tubular dielectric metal oxide spacers and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and word lines consisting essentially of molybdenum layers located over a substrate; and memory stack structures extending through each layer in the alternating stack, wherein: each of the memory stack structures comprises a memory film and a vertical semiconductor channel contacting an inner sidewall of the memory film; and each memory film comprises a vertical stack of discrete tubular dielectric metal oxide spacers in contact with a respective one of the molybdenum layers, a continuous silicon oxide blocking dielectric layer contacting an inner sidewall of each of the tubular dielectric metal oxide spacers, a vertical stack of charge storage material portions, and a tunneling dielectric layer contacting each of the charge storage material portions and the vertical semiconductor channel.

According to another aspect of the present disclosure, a method of forming a three-dimensional memory device is provided, which comprises: forming an alternating stack of insulating layers and molybdenum layers located over a substrate; forming a memory opening through the alternating stack; forming annular recesses at each level of the molybdenum layers around the memory opening by laterally recessing the molybdenum layers selective to the insulating layers; forming a vertical stack of tubular dielectric metal oxide spacers on sidewalls of the molybdenum layers in the annular recesses; forming a continuous silicon oxide blocking dielectric layer on the tubular dielectric metal oxide spacers; forming a vertical stack of charge storage material portions over the continuous silicon oxide blocking dielectric; forming a tunneling dielectric layer over the charge storage material portions; and forming a vertical semiconductor channel on the tunneling dielectric layer.

BRIEF DESCRIPTION OF THE DRAWINGS

FIGS. 5A-5M are sequential schematic vertical cross-sectional views of a memory opening within the exemplary structure during formation of a first exemplary memory opening fill structure according to an embodiment of the present disclosure.

FIGS. 6A-6I are sequential schematic vertical cross-sectional views of a memory opening within the exemplary structure during formation of a second exemplary memory opening fill structure according to an embodiment of the present disclosure.

DETAILED DESCRIPTION

Figure 1:
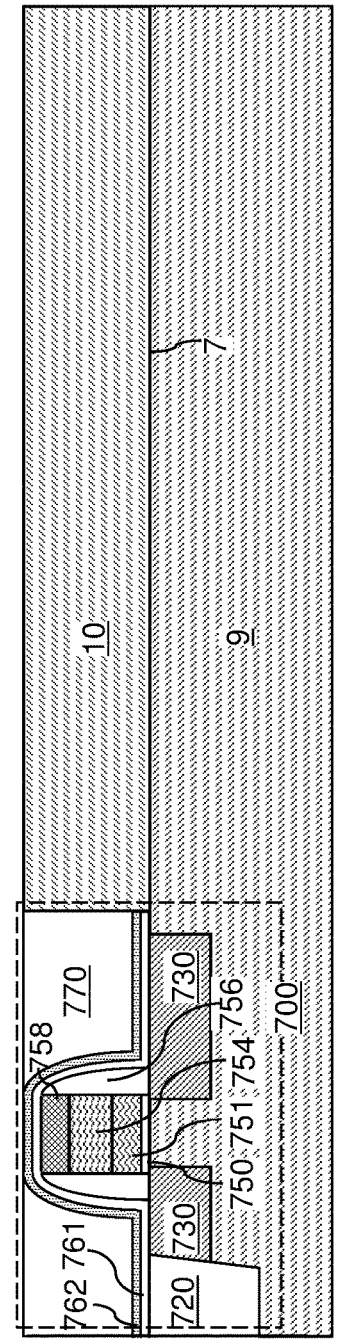
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional memory device including molybdenum word lines and self-aligned tubular dielectric metal oxide spacers and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array.

In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from 1.0 S/m to $1.0\times10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of molybdenum layers can be provided between the memory array region 100 and the peripheral device region 200.

Figure 2:
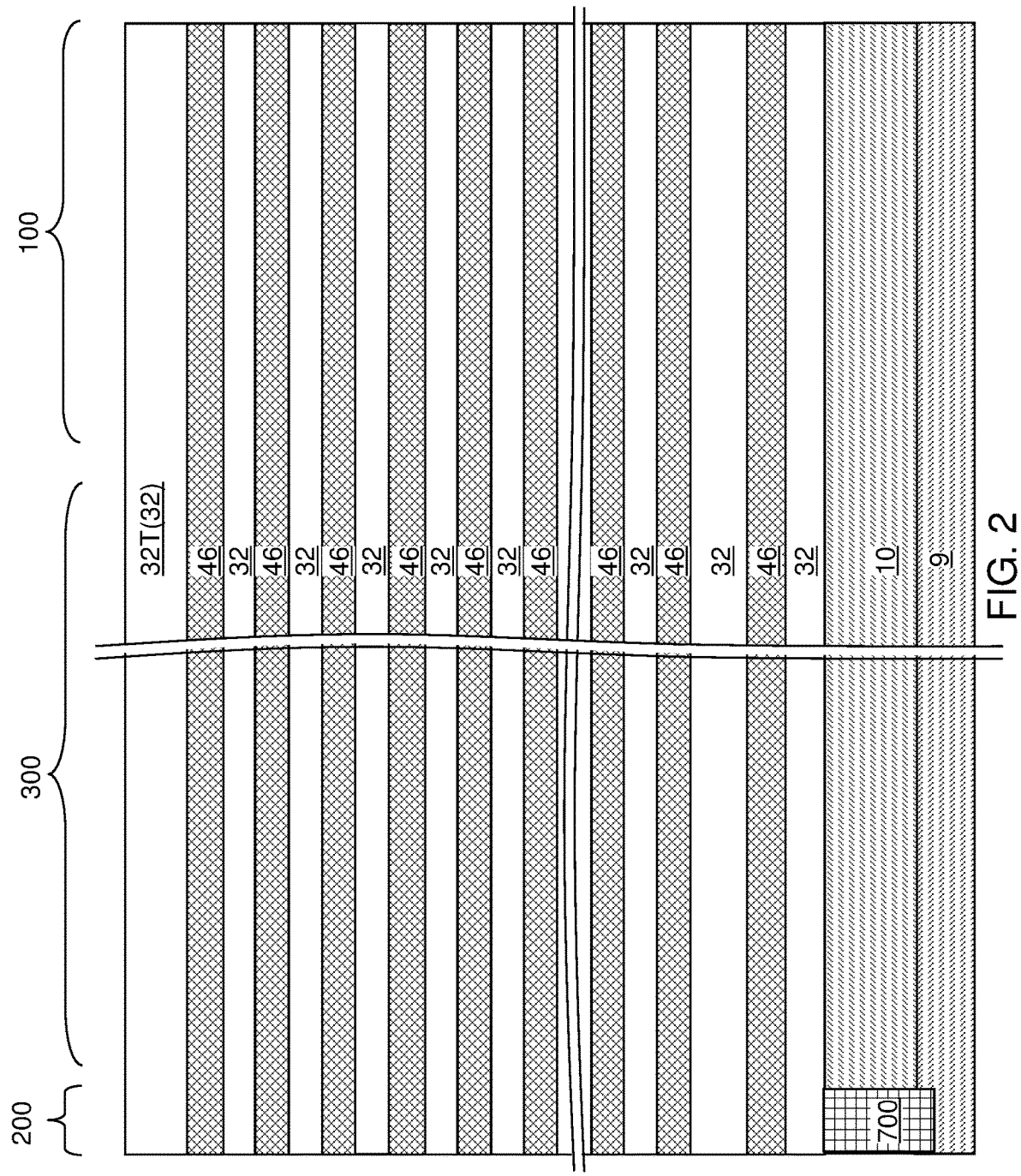
FIG. 2 is a schematic vertical cross-sectional view of the exemplary structure after formation of an alternating stack of insulating layers and molybdenum layers according to an embodiment of the present disclosure.

Referring to FIG. 2, a stack of an alternating plurality of insulating layers 32 and molybdenum layer 46 is formed over the top surface of the substrate (9, 10). As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. In one embodiment, an instance of the first elements and an instance of the second elements may form a unit that is repeated with periodicity within the alternating plurality.

The stack of the alternating plurality is herein referred to as an alternating stack (32, 46). Insulating materials that can be employed for the insulating layers 32 include, but are not limited to, silicon oxide (including doped or undoped silicate glass), silicon nitride, silicon oxynitride, organosilicate glass (OSG), spin-on dielectric materials, and organic insulating materials. In one embodiment, each of the insulating layers 32 consists essentially of undoped silicate glass, a doped silicate glass, or organosilicate glass. In one embodiment, silicon oxide is employed for the insulating layers 32, and tetraethyl orthosilicate (TEOS) can be employed as a precursor gas that deposits the silicon oxide material of the insulating layers 32.

The molybdenum layers 46 can consist essentially of molybdenum, and can be formed by chemical vapor deposition or atomic layer deposition. For example, a molybdenum-containing precursor gas can be thermally decomposed in a chemical vapor deposition to deposit each molybdenum layer 46. Nonlimiting examples of molybdenum-containing precursors include bicyclo[2.2.1]hepta-2,5-diene)tetracarbonyl molybdenum ($C_{11}H_8MoO_4$), bis(cyclopentadienyl) molybdenum dichloride ($C_{10}H_{10}Cl_2$ Mo), cyclopentadienyl molybdenum tricarbonyl ($C_{16}H_{10}Mo_2O_6$), molybdenum hexacarbonyl ($Mo(CO)_6$), and (propylcyclopentadienyl)molybdenum tricarbonyl dimer ($C_{22}H_{22}Mo_2O_6$).

The thicknesses of the insulating layers 32 and the molybdenum layers 46 can be in a range from 20 nm to 50 nm, although lesser and greater thicknesses can be employed for each insulating layer 32 and for each molybdenum layer 46. The number of repetitions of the pairs of an insulating layer 32 and a molybdenum layer (e.g., a control gate electrode or a molybdenum layer) 42 can be in a range from 2 to 1,024, and typically from 8 to 256, although a greater number of repetitions can also be employed. In one embodiment, each molybdenum layer 46 in the alternating stack (32, 46) can have a uniform thickness that is substantially invariant within each respective molybdenum layer 46.

The topmost layer of the alternating stack (32, 46) is herein referred to as a topmost insulating layer 32T. The topmost insulating layer 32T can have a greater thickness than each of the insulating layers 32. The topmost insulating layer 32T can be deposited, for example, by chemical vapor deposition. In one embodiment, the topmost insulating layer 32T can be a silicon oxide layer.

Figure 3:
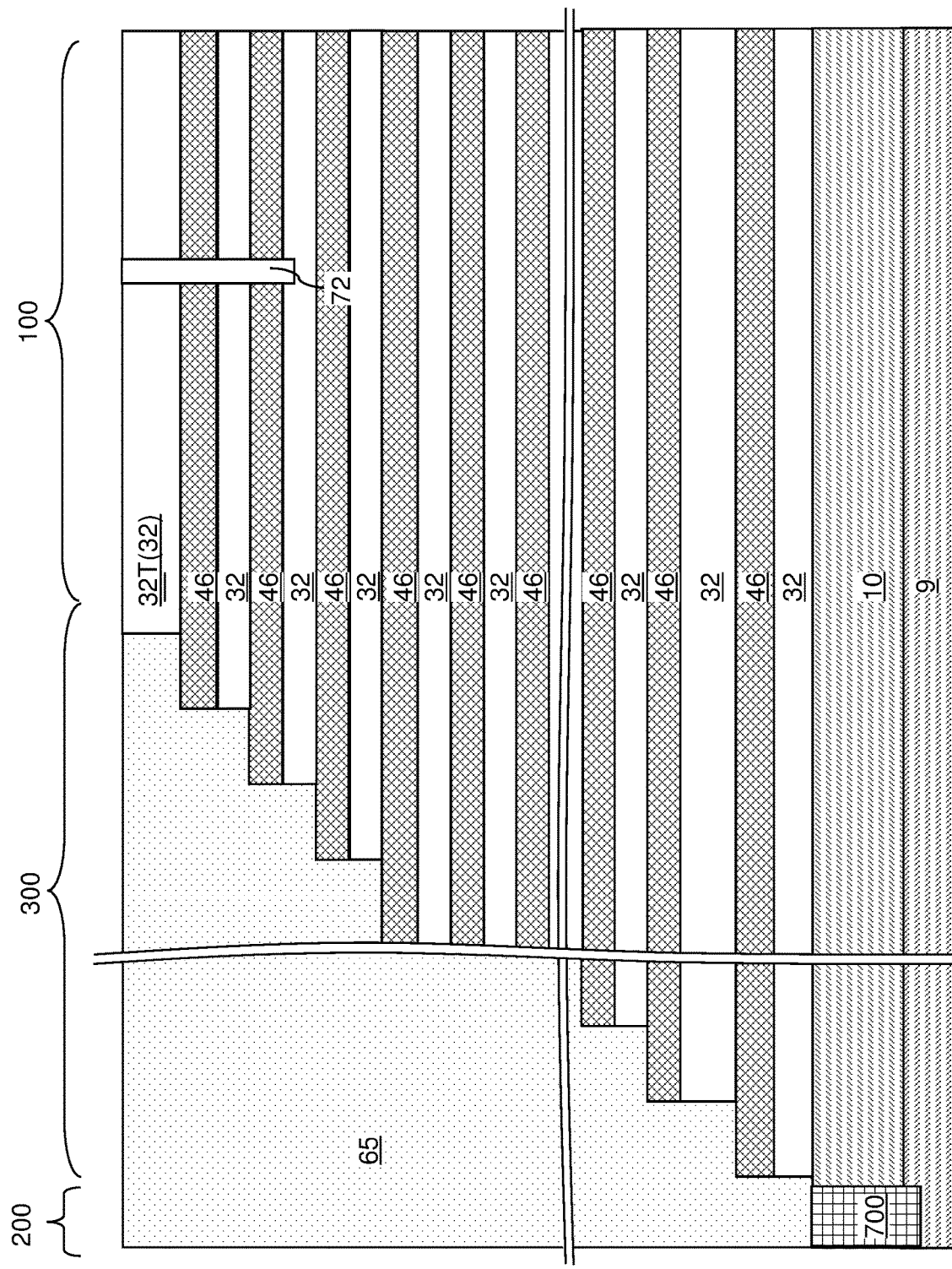
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 46), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 46) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each molybdenum layer 46 other than a topmost molybdenum layer 46 within the alternating stack (32, 46) laterally extends farther than any overlying molybdenum layer 46 within the alternating stack (32, 46) in the terrace region. The terrace region includes stepped surfaces of the alternating stack (32, 46) that continuously extend from a bottommost layer within the alternating stack (32, 46) to a topmost layer within the alternating stack (32, 46).

Each vertical step of the stepped surfaces can have the height of one or more pairs of an insulating layer 32 and a molybdenum layer. In one embodiment, each vertical step can have the height of a single pair of an insulating layer 32 and a molybdenum layer 46. In another embodiment, multiple "columns" of staircases can be formed along a first horizontal direction hd1 such that each vertical step has the height of a plurality of pairs of an insulating layer 32 and a molybdenum layer 46, and the number of columns can be at least the number of the plurality of pairs. Each column of staircase can be vertically offset among one another such that each of the molybdenum layers 46 has a physically exposed top surface in a respective column of staircases. In the illustrative example, two columns of staircases are formed for each block of memory stack structures to be subsequently formed such that one column of staircases provide physically exposed top surfaces for odd-numbered molybdenum layers 46 (as counted from the bottom) and another column of staircases provide physically exposed top surfaces for even-numbered molybdenum layers (as counted from the bottom). Configurations employing three, four, or more columns of staircases with a respective set of vertical offsets among the physically exposed surfaces of the molybdenum layers 46 may also be employed. Each molybdenum layer 46 has a greater lateral extent, at least along one direction, than any overlying molybdenum layers 46 such that each physically exposed surface of any molybdenum layer 46 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the topmost insulating layer 32T and a subset of the molybdenum layers 46 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the topmost insulating layer 32T.

Figure 4A:
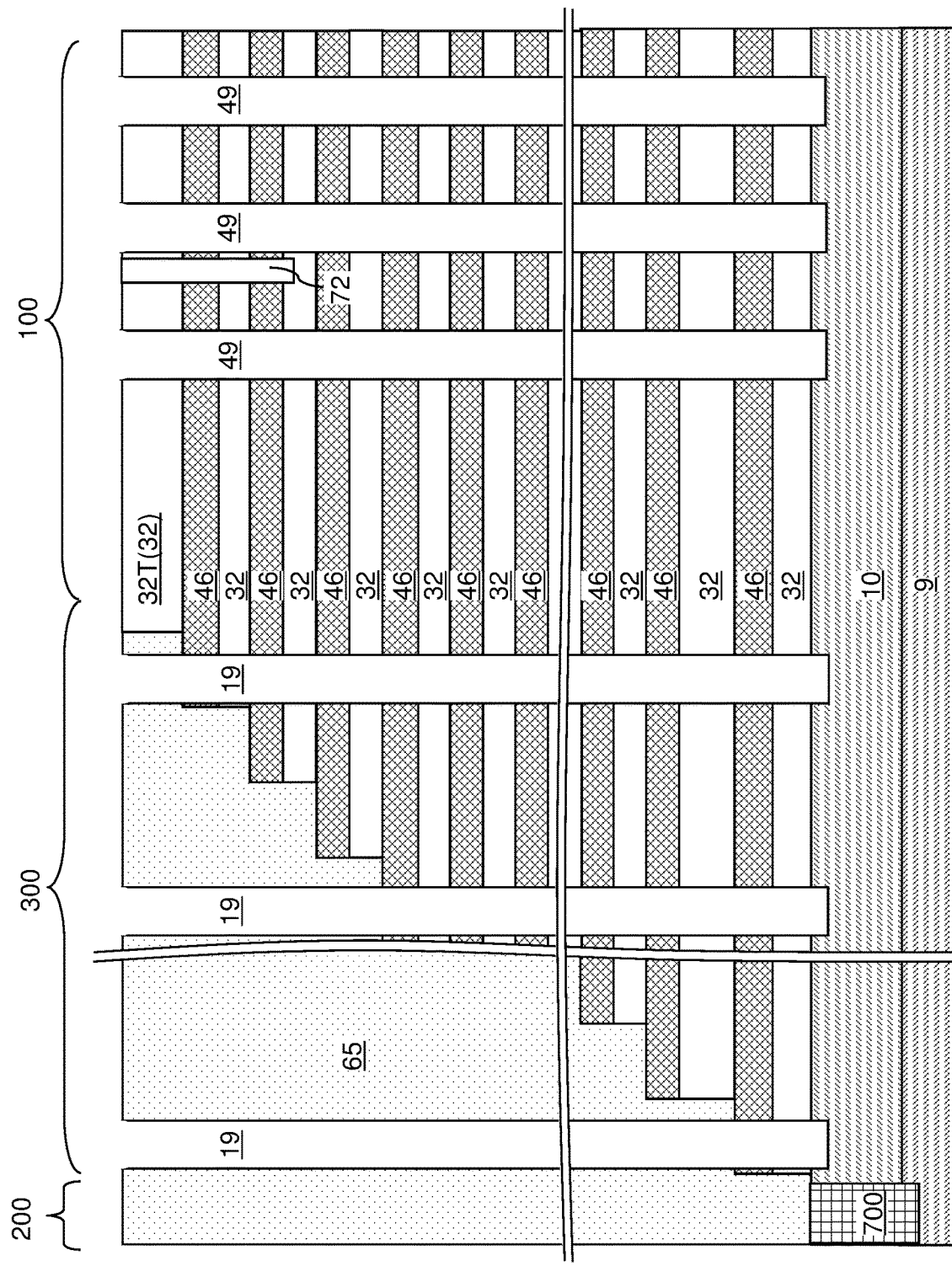
FIG. 4A is a schematic vertical cross-sectional view of the exemplary structure after formation of memory openings and support openings according to an embodiment of the present disclosure.
Figure 4B:
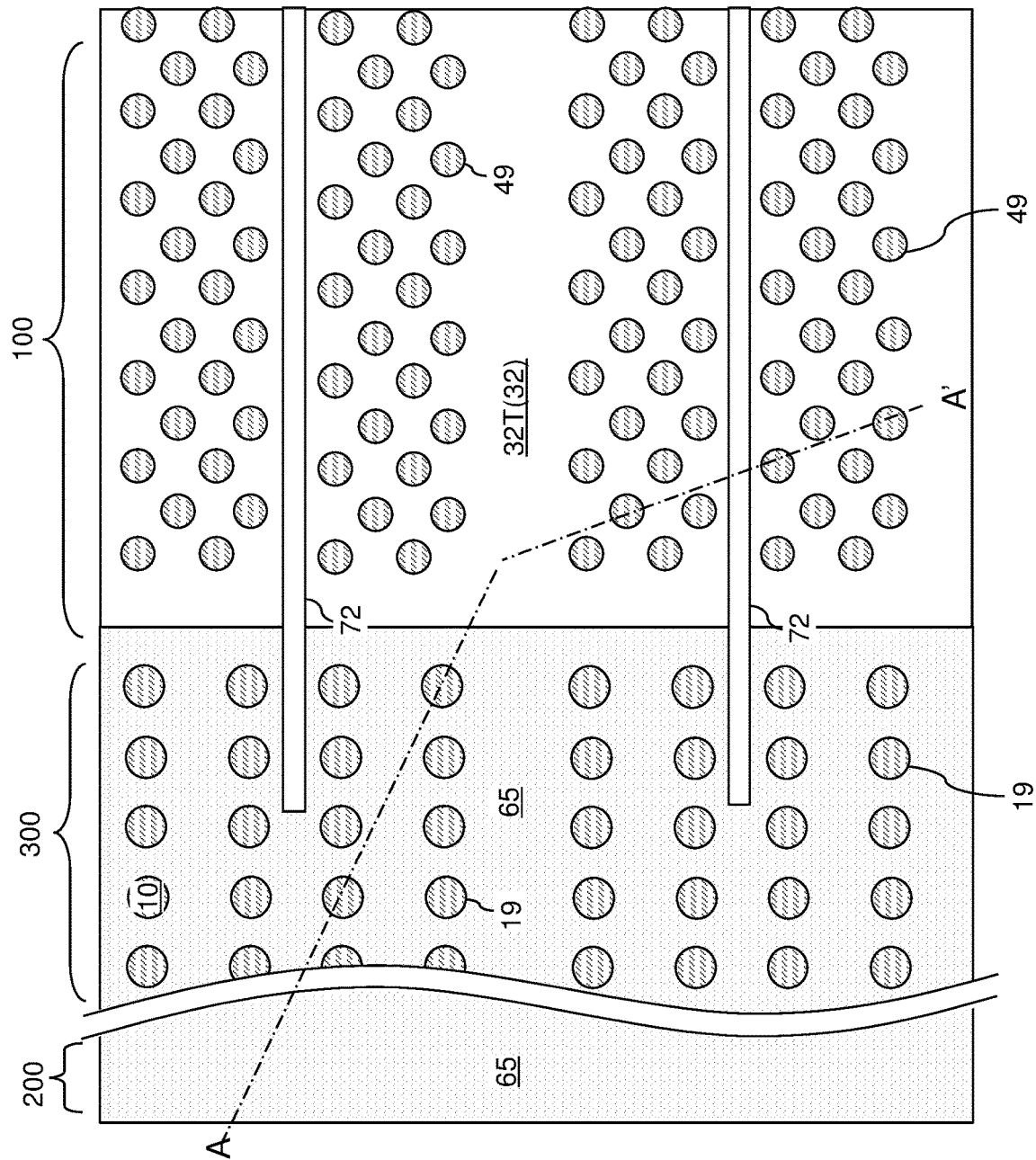
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the topmost insulating layer 32T or the retro-stepped dielectric material portion 65, and through the alternating stack (32, 46) by at least one anisotropic etch that employs the patterned lithographic material stack as an etch mask. Portions of the alternating stack (32, 46) underlying the openings in the patterned lithographic material stack are etched to form memory openings 49 and optional support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. In one embodiment, the support openings 19 may be omitted. The memory openings 49 are formed through the topmost insulating layer 32T and the entirety of the alternating stack (32, 46) in the memory array region 100. The support openings 19 are formed through the retro-stepped dielectric material portion 65 and the portion of the alternating stack (32, 46) that underlie the stepped surfaces in the staircase region 300.

The memory openings 49 extend through the entirety of the alternating stack (32, 46). The support openings 19 extend through a subset of layers within the alternating stack (32, 46). The chemistry of the anisotropic etch process employed to etch through the materials of the alternating stack (32, 46) can alternate to optimize etching of the first and second materials in the alternating stack (32, 46). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 46) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5M illustrate structural changes in a memory opening 49, which is one of the memory openings 49 during formation of first exemplary memory opening fill structures the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the topmost insulating layer 32T, the alternating stack (32, 46), and optionally into an upper portion of the semiconductor material layer 10. A top surface of the semiconductor material layer 10 can be physically exposed at the bottom of each memory opening 49. At this processing step, each support opening 19 can extend through the retro-stepped dielectric material portion 65, a subset of layers in the alternating stack (32, 46), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed.

Referring to FIG. 5B, the molybdenum layers 46 can be laterally recessed partially to form lateral recesses, for example, by an isotropic etch. The lateral recesses can have cylindrical annular shapes, and are herein referred to as annular recesses 43. Generally, the annular recesses 43 can be formed at each level of the molybdenum layers 46 around the memory opening 49 by laterally recessing the molybdenum layers 46 selective to the insulating layers 32. The isotropic etch process can include a wet etch process employing an etchant that etches metallic materials selective to insulating materials and semiconductor materials. For example, the isotropic etch process can include a wet etch process employing a 1:1 mixture of hydrochloric acid and hydrogen peroxide. The lateral recess distance of sidewalls of the molybdenum layers 46 relative to the sidewalls of the insulating layers 32 can be in a range from 10 nm to 50 nm, although lesser and greater lateral recess distances can also be employed.

Referring to FIG. 5C, a metal can be selectively grown on the physically exposed surfaces of the molybdenum layers 46 in the annular recesses 43 without growth of the metal on the surfaces of the insulating layers 32. The deposited metal can be a metal that can nucleate on, and grow from, molybdenum surfaces, and does not nucleate on insulating surfaces. Further, the metal can be a metal that can be oxidized to provide a dielectric material. For example, the metal may be aluminum. Selective deposition of aluminum on metallic surfaces while suppressing deposition of aluminum on insulating surfaces (such as surfaces of silicon oxide) can be performed employing a selective aluminum deposition process described in Tsubouchi et al., Selective Aluminum Chemical Vapor Deposition, Journal of Vacuum Science & Technology A 10, 856 (1992), incorporated herein by reference. The selectively deposited metal forms tubular metal portions 41, which have tubular shaped. Generally, any metal that can be selectively deposited on molybdenum surfaces while suppressing deposition on dielectric surfaces and can be subsequently oxidized into a dielectric metal oxide material may be employed in lieu of aluminum.

The tubular metal portions 41 can be grown selectively on cylindrical surfaces of the molybdenum layers 46 in the annular recesses 43 of each memory opening 49 while suppressing growth of the metal from surfaces of the insulating layers 32. A memory cavity 49' is present after formation of the vertical stack of tubular metal portions 41 within each memory opening 49. Each memory cavity 49' includes unfilled volumes of the annular recesses 43 that are present after formation of a vertical stack of tubular metal portions 41 within each memory opening 49. In one embodiment, any collaterally deposited metal portion that is deposited on the physically exposed top surface of the semiconductor material layer 10 can be removed, for example, by performing an anisotropic etch process. Each tubular metal portion 41 can have a uniform thickness throughout, which is a lateral distance between an inner cylindrical sidewall of a respective tubular metal portion 41 and an outer cylindrical sidewall of the respective tubular metal portion 41. The thickness of each tubular metal portion 41 (as measured between an inner cylindrical sidewall and an outer cylindrical sidewall) can be in a range from 1.5 nm to 15 nm, such as from 3 nm to 10 nm, although lesser and greater thicknesses can also be employed.

Referring to FIG. 5D, an oxidation process can be performed to convert each vertical stack of tubular metal portions 41 into a vertical stack of tubular dielectric metal oxide spacers 51. The oxidation process may be a thermal oxidation process or a plasma oxidation process. For example, if the tubular metal portions 41 include, and/or consist essentially of, aluminum, the tubular dielectric metal oxide spacers 51 can include, and/or consist essentially of, aluminum oxide. A vertical stack of tubular dielectric metal oxide spacers 51 is formed on sidewalls of the molybdenum layers 46 around the annular recesses of each memory opening 49. Each tubular dielectric metal oxide spacer 51 within the vertical stack of tubular dielectric metal oxide spacers 51 in each memory opening 49 contacts a cylindrical sidewall of, and has a same height as, a respective one of the molybdenum layers 46. The thickness of each tubular dielectric metal oxide spacer 51 (as measured between an inner cylindrical sidewall and an outer cylindrical sidewall) can be in a range from 3 nm to 30 nm, such as from 6 nm to 20 nm, although lesser and greater thicknesses can also be employed. Each tubular dielectric metal oxide spacer 51 can contact a respective one of the molybdenum layers 46, and can have the same height as the respective one of the molybdenum layers 46.

An oxide material plate 13 can be collaterally formed at the bottom of each memory opening 49 during the oxidation process. In case metal is not deposited on the top surface of the semiconductor material layer 10 during formation of the tubular metal portions 41 during the processing steps of FIG. 5C or in case any metal deposited on the top surface of the semiconductor material layer 10 is removed by an anisotropic etch process at the processing steps of FIG. 5C, the oxide material plate 13 can include a semiconductor oxide material, such as silicon oxide. In case metal is deposited on the top surface of the semiconductor material layer 10 at the processing steps of FIG. 5C and is not subsequently removed, the oxide material plate 13 can include a same dielectric metal oxide material as the tubular dielectric metal oxide spacers 51.

Referring to FIG. 5E, an anisotropic etch process (such as a reactive ion etch process) can be performed to etch the oxide material plate 13 at the bottom of each memory cavity 49'. A top surface of the semiconductor material layer 10 can be physically exposed at the bottom of each memory opening 49. Portions 43' of the annular recesses 43 remain unfilled.

Referring to FIG. 5F, a continuous silicon oxide blocking dielectric layer 52 can be conformally deposited on the tubular dielectric metal oxide spacers 51. The continuous silicon oxide blocking dielectric layer 52 can be deposited by a conformal deposition process on physically exposed surfaces of the insulating layers 32, on inner sidewalls of the tubular dielectric metal oxide spacers 51, and on the top surface of the semiconductor material layer 10 at the bottom of each memory opening 49. For example, the continuous silicon oxide blocking dielectric layer 52 can be formed by a chemical vapor deposition process in which tetraethylorthosilicate (TEOS) is thermally decomposed to form silicon oxide. The continuous silicon oxide blocking dielectric layer 52 can be formed directly on physically exposed annular horizontal surfaces of the insulating layers 32 that overlie or underlie a respective one of the annular recesses. The continuous silicon oxide blocking dielectric layer 52 continuously extends through each layer in the alternating stack (32, 46) and directly contacts each layer in the alternating stack (32, 46). The thickness of the continuous silicon oxide blocking dielectric layer 52 can be in a range from 1 nm to 10 nm, such as from 2 nm to 6 nm, although lesser and greater thicknesses can also be employed.

The continuous silicon oxide blocking dielectric layer 52 can have a laterally undulating vertical cross-sectional profile in which first tubular segments 52A located in the remaining portions 43' of the annular recesses 43 at levels of the molybdenum layers 46 are laterally offset outward with respect to second tubular segments 52B located at levels of the insulating layers 32. The first tubular segments 52A are connected to second tubular segments 52B by planar annular segments 52C of the continuous silicon oxide blocking dielectric layer 52 that contact a respective horizontal surface of the insulating layers 32. In one embodiment, the planar annular segments 52C of the continuous silicon oxide blocking dielectric layer 52 contact the respective horizontal surface of the insulating layers 32 at annular horizontal surfaces. Each of the annular horizontal surfaces comprises an inner periphery and an outer periphery that is laterally spaced from the inner periphery by a uniform spacing 53. Each of the annular horizontal surfaces is coplanar with a respective horizontal interface between a respective one of the insulating layers 32 and a respective one of the molybdenum layers 46. In one embodiment, the continuous silicon oxide blocking dielectric layer 52 contacts a top surface of the semiconductor material layer 10 that underlies the alternating stack (32, 46) and located in the substrate (9, 10).

Figure 5H:
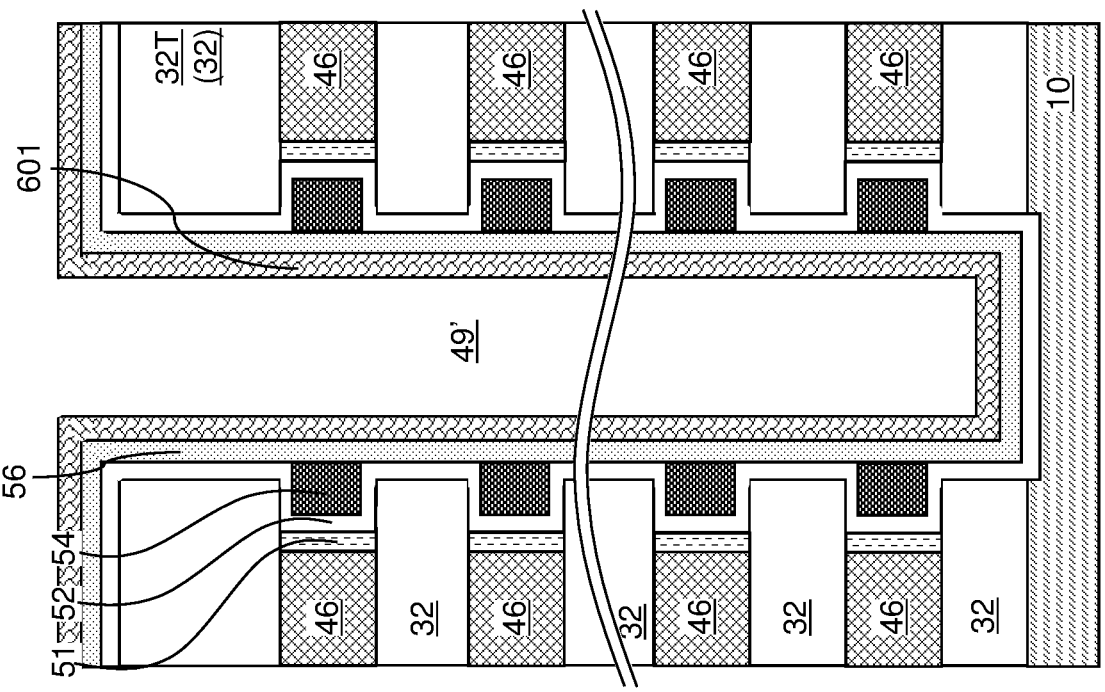
Figure 5G:
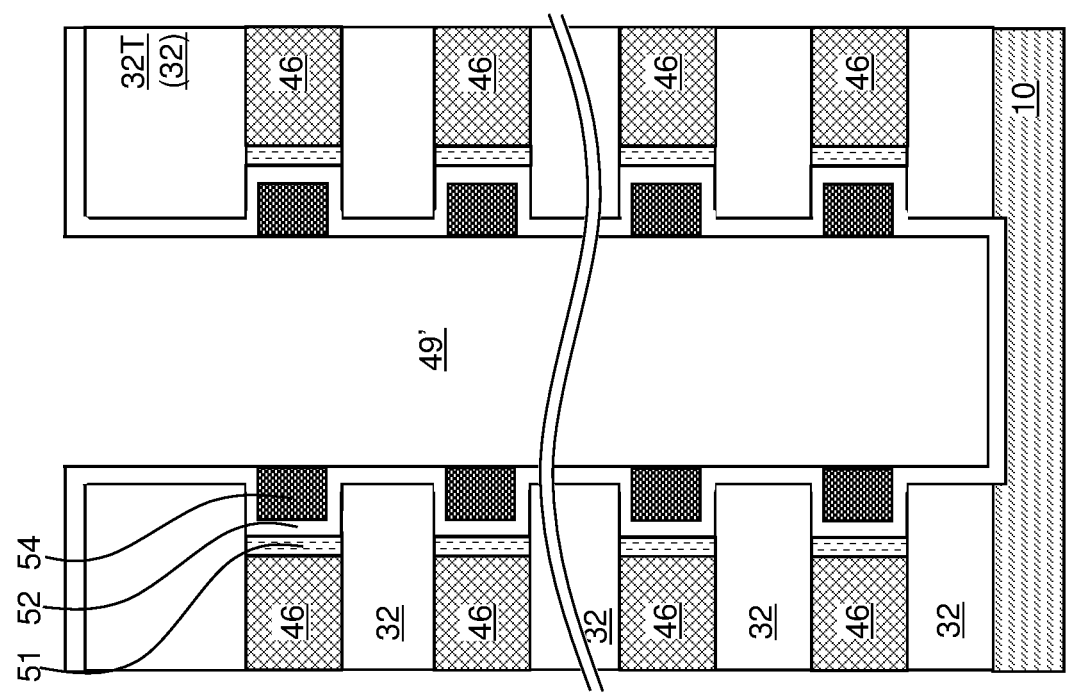

Referring to FIG. 5G, a charge storage material layer can be conformally deposited on the continuous silicon oxide blocking dielectric layer 52 and in the remaining portions 43' of the annular recesses 43. The charge storage material layer can include any material that can store electrical charges therein. In one embodiment, the charge storage material layer can include a dielectric material such as silicon nitride. In another embodiment, the charge storage material layer can include a floating gate material, which may be a conductive material (e.g., a metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, and/or a combination thereof) and/or a semiconductor material (e.g., polycrystalline or amorphous semiconductor material including at least one elemental semiconductor element or at least one compound semiconductor material). The thickness of the charge storage material layer can be selected such that the entirety of the lateral recesses is filled with the charge storage material layer.

An anisotropic etch process can be performed to remove the unmasked portions of the charge storage material layer located above the topmost insulating layer 32T and inside a cylindrical volume within each memory opening 49. Portions of the charge storage material layer located outside the remaining portions 43' of the annular recesses 43 are removed by the anisotropic etch process. Remaining portions of the charge storage material layer after the anisotropic etch process within the remaining portions 43' of the annular recesses 43 in each memory opening 49 comprise a vertical stack of charge storage material portions 54. Thus, a vertical stack of charge storage material portions 54 is formed in the unfilled volumes of the annular recesses within each memory opening 49. Each charge storage material portion 54 can be a cylindrical charge storage material portion having an outer cylindrical sidewall, an inner cylindrical sidewall, and a pair of annular horizontal surfaces adjoined to the outer cylindrical sidewall and the inner cylindrical sidewall.

Each charge storage material portion 54 within the vertical stack of charge storage material portions 54 is laterally spaced from a respective one of the tubular dielectric metal oxide spacers 51 by the continuous silicon oxide blocking dielectric layer 52. Each charge storage material portion 54 has a height that is less than the height of the respective one of the tubular dielectric metal oxide spacers 51 by twice the thickness of the continuous silicon oxide blocking dielectric layer 52.

Referring to FIG. 5H, a tunneling dielectric layer 56 is formed over the charge storage material portions 54. The tunneling dielectric layer 56 can be deposited on inner sidewalls of the charge storage material portions 54 and physically exposed surfaces of the continuous silicon oxide blocking dielectric layer 52. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The tunneling dielectric layer 56 is deposited directly on each of the charge storage material portions 54 and directly on segments of the continuous silicon oxide blocking dielectric layer 52 located at levels of the insulating layers 32. An outer sidewall of the tunneling dielectric layer 56 contacts inner sidewalls of tubular segments of the continuous silicon oxide blocking dielectric layer 52 at each level of the insulating layers 32. The outer sidewall and the inner sidewall of the tunneling dielectric layer 56 extend straight without any lateral step from a topmost layer of the alternating stack (32, 46) to a bottommost layer of the alternating stack (32, 46).

An optional first semiconductor channel layer 601 can be optionally deposited on the tunneling dielectric layer 56. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with deposited material portions (51, 52, 54, 56, 601).

Referring to FIG. 5I, the optional first semiconductor channel layer 601, the tunneling dielectric layer 56, and the continuous silicon oxide blocking dielectric layer 52 are sequentially anisotropically etched employing at least one anisotropic etch process. The portions of the first semiconductor channel layer 601, the tunneling dielectric layer 56, and the continuous silicon oxide blocking dielectric layer 52 located above the top surface of the topmost insulating layer 32T can be removed by the at least one anisotropic etch process. Further, the horizontal portions of the first semiconductor channel layer 601, the tunneling dielectric layer 56, and the continuous silicon oxide blocking dielectric layer 52 at a bottom of each memory cavity 49' can be removed to form openings in remaining portions thereof. Each of the first semiconductor channel layer 601, the tunneling dielectric layer 56, and the continuous silicon oxide blocking dielectric layer 52 can be etched by a respective anisotropic etch process employing a respective etch chemistry, which may, or may not, be the same for the various material layers. Horizontal portions of the tunneling dielectric layer 56 and the continuous silicon oxide blocking dielectric layer 52 at the bottom of each memory opening 49 are removed by the anisotropic etch process. A portion of the top surface of the semiconductor material layer 10 is physically exposed after the anisotropic etch process at the bottom of each memory opening 49.

Each remaining portion of the first semiconductor channel layer 601 can have a tubular configuration. A tunneling dielectric layer 56 is located over the continuous silicon oxide blocking dielectric layer 52. A contiguous set including a vertical stack of tubular dielectric metal oxide spacers 51, a continuous silicon oxide blocking dielectric layer 52, a vertical stack of charge storage material portions 54, and a tunneling dielectric layer 56 in a memory opening 49 constitutes a memory film 50. Each memory film 50 includes a plurality of charge storage regions (comprising the vertical stack of charge storage material portions 54) that are insulated from surrounding conductive or semiconducting materials by the continuous silicon oxide blocking dielectric layer 52 and the tunneling dielectric layer 56. In one embodiment, the first semiconductor channel layer 601, the tunneling dielectric layer 56, and the continuous silicon oxide blocking dielectric layer 52 can have vertically coincident sidewalls.

Referring to FIG. 5J, a second semiconductor channel layer 602 can be deposited directly on the semiconductor surface of the semiconductor material layer 10 and directly on the first semiconductor channel layer 601 (if present, or on the tunneling dielectric 56 if layer 601 is omitted). The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5L:
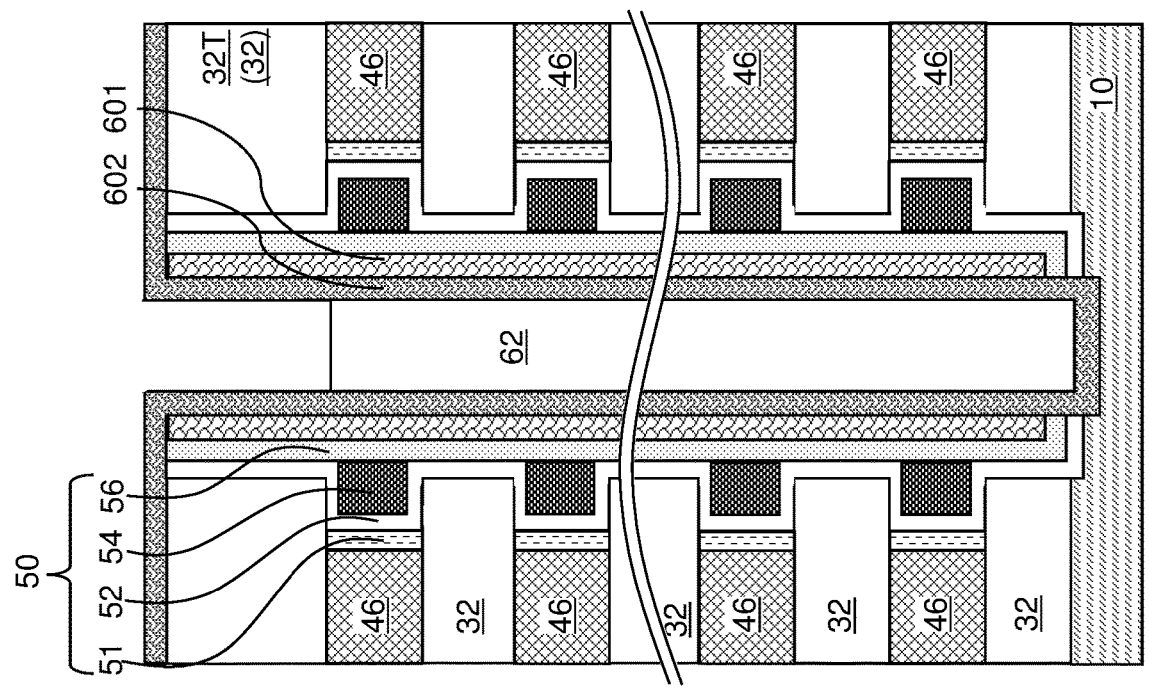
Figure 5K:
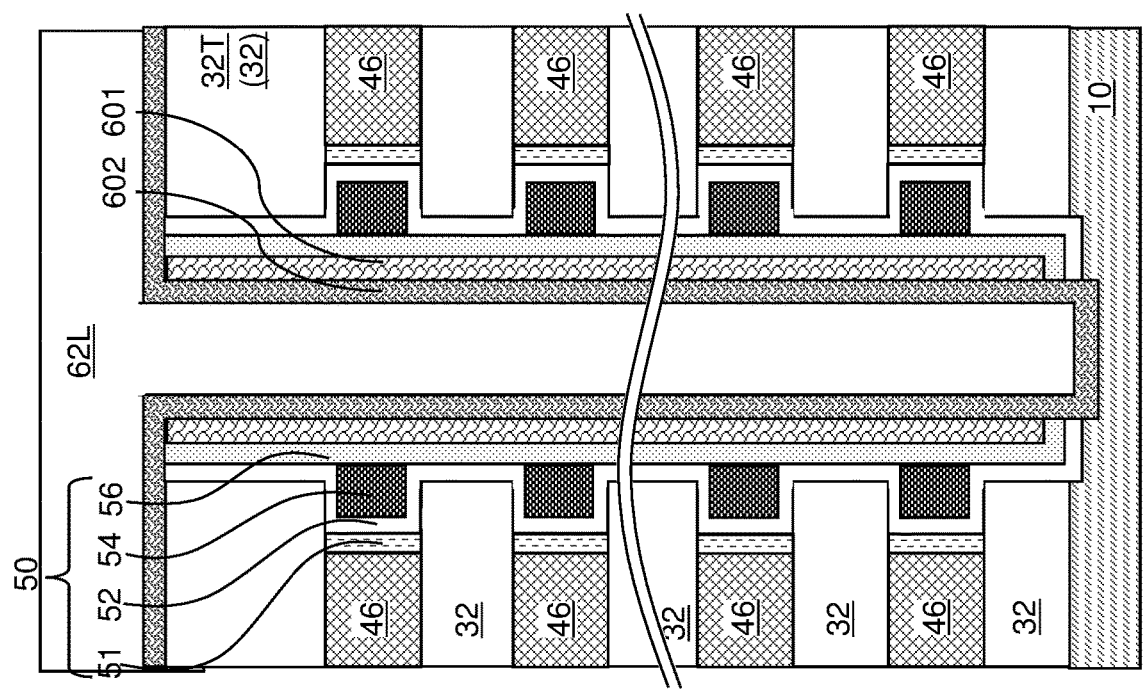

Referring to FIG. 5K, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5L, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the topmost insulating layer 32T and a second horizontal plane including the bottom surface of the topmost insulating layer 32T. Each remaining portion of the dielectric core layer 62L constitutes a dielectric core 62.

Figure 5M:
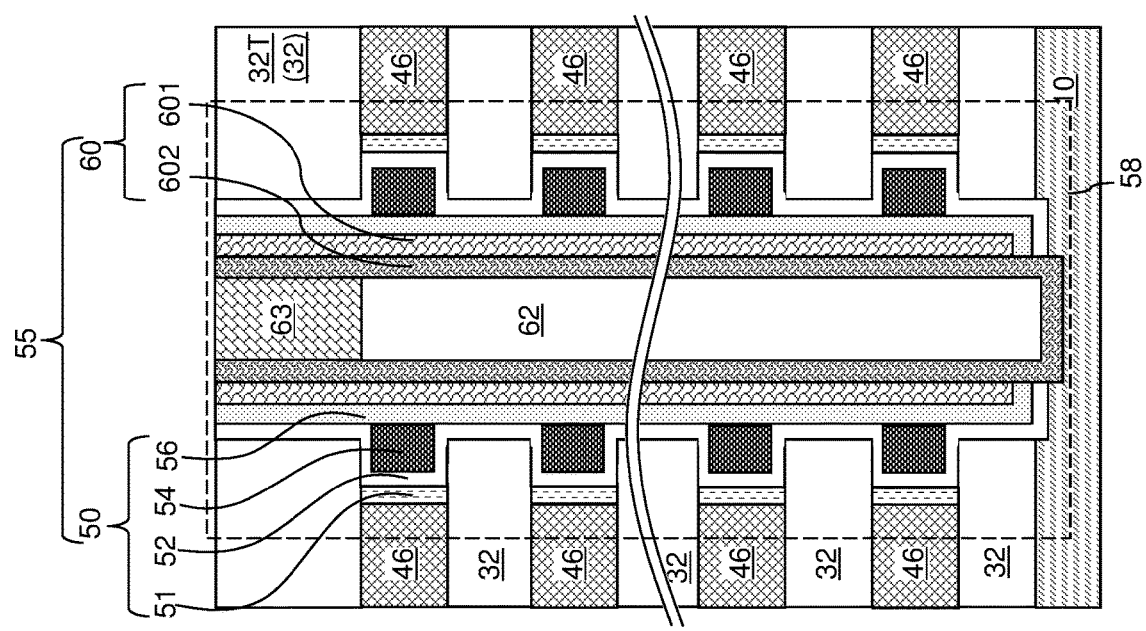

Referring to FIG. 5M, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material can be removed from above the top surface of the topmost insulating layer 32T, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the topmost insulating layer 32T can be concurrently removed by a planarization process. Each remaining portion of the second semiconductor channel layer 602 can be located entirely within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. The vertical semiconductor channel 60 is formed directly on a portion of the top surface of the semiconductor material layer 10 and on the tunneling dielectric layer 56.

A tunneling dielectric layer 56 is surrounded by a vertical stack of charge storage material portions 54, and laterally surrounds a portion of the vertical semiconductor channel 60. Each adjoining set of a tunneling dielectric layer 56, a vertical stack of charge storage material portions 54, and a continuous silicon oxide blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising a vertical stack of charge storage material portions 54, a continuous silicon oxide blocking dielectric layer 52, and a vertical stack of tubular dielectric metal oxide spacers 51. Each combination of a memory stack structure 55, a dielectric core 62, and a drain region 63 within a memory opening 49 is herein referred to as a memory opening fill structure 58. Each combination of a memory film 50, a vertical semiconductor channel 60, a dielectric core 62, and a drain region 63 within each support opening 19 fills the respective support openings 19, and constitutes a support pillar structure.

The memory stack structures 55 can vertically extending through each layer in the alternating stack (32, 46). Each vertical semiconductor channel 60 contacts an inner sidewall of a memory film 50. Each memory film 50 comprises a vertical stack of tubular dielectric metal oxide spacers 51 in contact with a respective one of the molybdenum layers 46, a continuous silicon oxide blocking dielectric layer 52 contacting an inner sidewall of each of the tubular dielectric metal oxide spacers 51, a vertical stack of charge storage material portions 54, and a tunneling dielectric layer 56 contacting each of the charge storage material portions 54 and the vertical semiconductor channel 60.

A plurality of memory opening fill structures 58 vertically extend through each layer within the alternating stack (32, 46). Each of the molybdenum layers 46 laterally surrounds a respective subset of the tubular dielectric metal oxide spacers 51 and directly contacts an entirety of an outer cylindrical sidewall of a respective subset of the tubular dielectric metal oxide spacers 51 located at a respective level from the substrate (9, 10).

In an alternative embodiment, the memory opening fill structures 58 and the support pillar structures can be formed in an alternative configuration. FIGS. 6A-6I illustrate structural changes in a memory opening 49, which is one of the memory openings 49, during formation of second exemplary memory opening fill structures of the second embodiment after the step shown in FIGS. 4A and 4B. The same structural change occurs simultaneously in each of the other memory openings 49 and in each of the support openings 19.

Referring to FIG. 6A, a memory opening 49 for forming the second configuration of the memory opening fill structure can be derived from the memory opening 49 of FIG. 5A by performing the processing steps of FIG. 5B with a shortened isotropic etch time. Thus, the annular recesses 43 formed at each level of the molybdenum layers 46 can have a lesser lateral recess distance than the lateral recess distance at the processing steps of FIG. 6B. In one embodiment, the lateral recess distance can be the same as the lateral thickness of the tubular dielectric metal oxide spacers 51 to be subsequently formed. In one embodiment, the lateral recess distance of the lateral recesses can be in a range from 3 nm to 30 nm, such as from 6 nm to 20 nm, although lesser and greater thicknesses can also be employed.

Referring to FIG. 6B, the processing steps of FIG. 5C can be performed to form a vertical stack of tubular metal portions 41 within each annular recess 43 in each memory opening 49. The processing steps of FIG. 5D can then be performed to convert the vertical stack of tubular metal portions 41 within each memory opening 49 into a respective vertical stack of tubular dielectric metal oxide spacers 51. Preferably, each tubular dielectric metal oxide spacer 51 completely fills the respective annular recess 43.

Figure 6D:
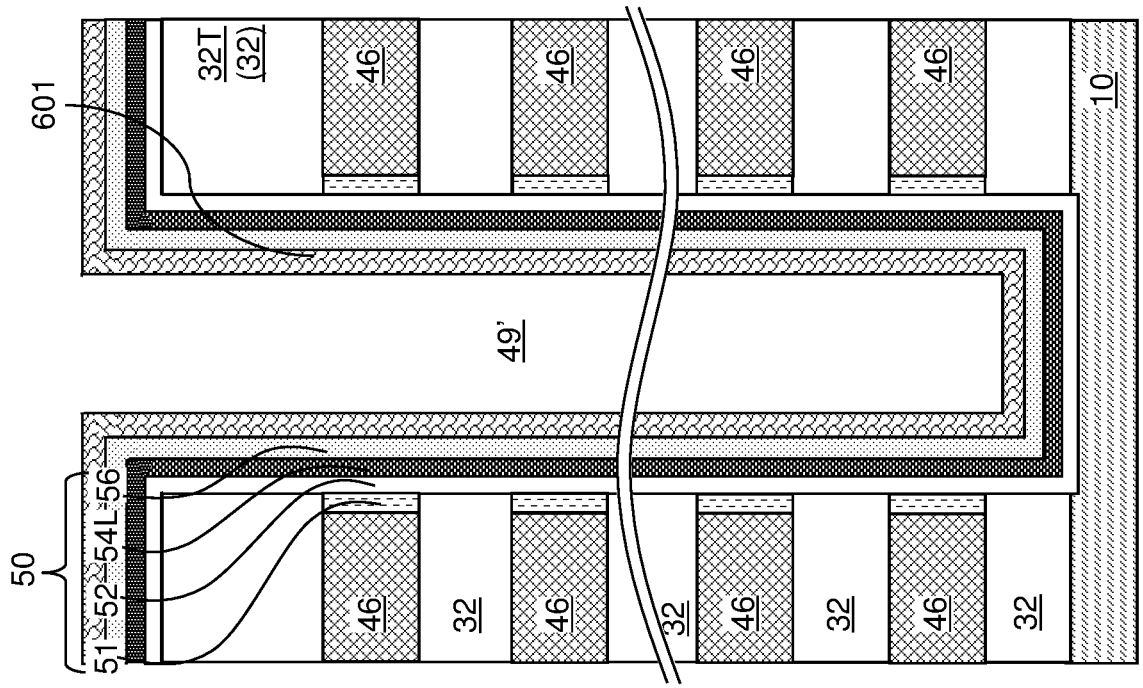
Figure 6C:
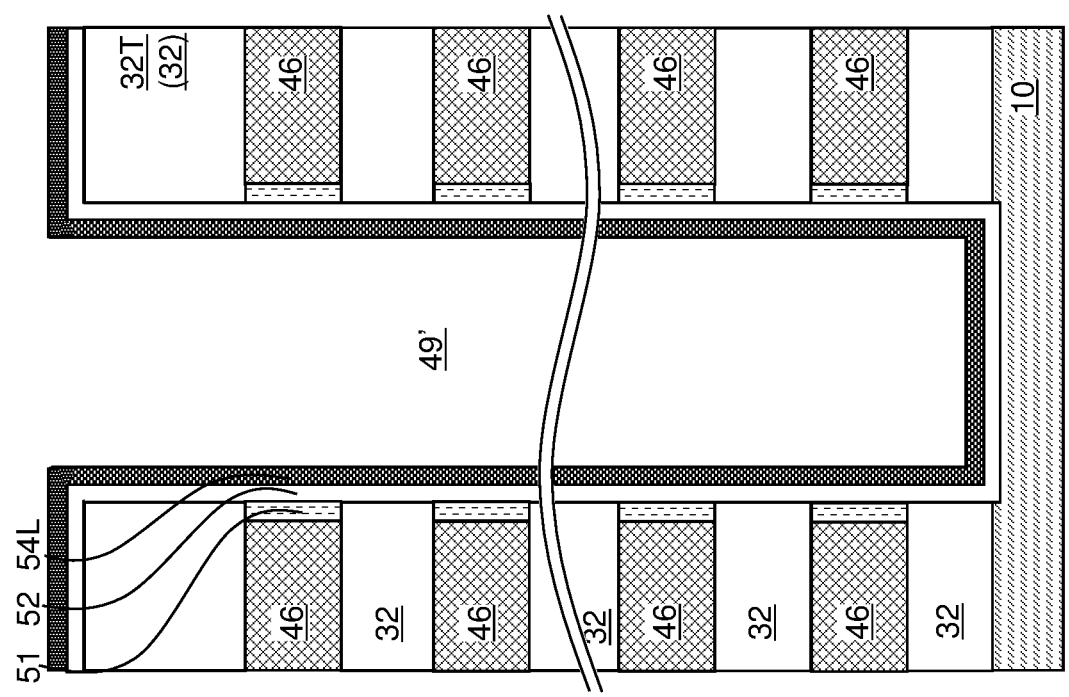

Referring to FIG. 6C, the processing steps of FIG. 5E may be performed to remove the oxide material plate 13 from the bottom of each memory opening 49. In case any portion of the vertical stack of tubular dielectric metal oxide spacers 51 protrudes out of the annular recesses 43 inward from a cylindrical vertical plane including sidewalls of the insulating layers 32 around each memory opening 49, such protruding portions of the vertical stack of tubular dielectric metal oxide spacers 51 can be removed by the anisotropic etch process that removes the oxide material plates 13. Inner sidewalls of the vertical stack of tubular dielectric metal oxide spacers 51 can be vertically coincident with sidewalls of the insulating layers 32 around each memory cavity 49', which is an unfilled portion of a respective memory opening 49.

Still referring to FIG. 6C, a continuous silicon oxide blocking dielectric layer 52 can be conformally deposited on the tubular dielectric metal oxide spacers 51 by performing the processing steps of FIG. 5F. The continuous silicon oxide blocking dielectric layer 52 can be deposited by a conformal deposition process on physically exposed surfaces of the insulating layers 32, on inner sidewalls of the tubular dielectric metal oxide spacers 51, and on the top surface of the semiconductor material layer 10 at the bottom of each memory opening 49. For example, the continuous silicon oxide blocking dielectric layer 52 can be formed by a chemical vapor deposition process in which tetraethylorthosilicate (TEOS) is thermally decomposed to form silicon oxide. The continuous silicon oxide blocking dielectric layer 52 can be formed directly on physically exposed annular horizontal surfaces of the insulating layers 32 that overlie or underlie a respective one of the annular recesses. The continuous silicon oxide blocking dielectric layer 52 continuously extends through each layer in the alternating stack (32, 46) and directly contacts each insulating layer 32 in the alternating stack (32, 46). The continuous silicon oxide blocking dielectric layer 52 can have a straight cylindrical outer sidewall and a straight cylindrical inner sidewall. The thickness of the continuous silicon oxide blocking dielectric layer 52 can be in a range from 1 nm to 10 nm, such as from 2 nm to 6 nm, although lesser and greater thicknesses can also be employed.

A charge storage material layer 54L can be conformally deposited on the continuous silicon oxide blocking dielectric layer 52. The charge storage material layer 54L can include any material that can store electrical charge therein. The charge storage material layer 54L can include any material that can be employed for the vertical stack of charge storage material portions 54 in the first configuration of the memory opening fill structure 58 illustrated in FIG. 5M. The charge storage material layer 54L includes a vertical stack of charge storage material portions located at each level of the molybdenum layers 46. The charge storage material layer 54L is a single continuous cylindrical charge storage material layer that vertically extends through each of the molybdenum layers 46 within the alternating stack (32, 46). The charge storage material layer 54L is laterally spaced from the tubular dielectric metal oxide spacers 51 by the continuous silicon oxide blocking dielectric layer 52.

Referring to FIG. 6D, a tunneling dielectric layer 56 is formed over the charge storage material portions 54. The tunneling dielectric layer 56 can be deposited directly on the charge storage material layer 54L. The tunneling dielectric layer 56 can include any material that can be employed for the tunneling dielectric layer 56 in the first configuration of the memory opening fill structure 58 illustrated in FIG. 5M.

An optional first semiconductor channel layer 601 can be optionally deposited on the tunneling dielectric layer 56. The optional first semiconductor channel layer 601 can have the same material composition and the same thickness as the first semiconductor channel layer 601 in the first configuration of the memory opening fill structure 58 illustrated in FIG. 5M.

Referring to FIG. 6E, the processing steps of FIG. 5I can be performed to anisotropically etch the optional first semiconductor channel layer 601, the tunneling dielectric layer 56, the charge storage material layer 54L, and the continuous silicon oxide blocking dielectric layer 52. Each remaining portion of the first semiconductor channel layer 601 can have a tubular configuration. A tunneling dielectric layer 56 is located over the charge storage material layer 54L and the continuous silicon oxide blocking dielectric layer 52. A contiguous set including a vertical stack of tubular dielectric metal oxide spacers 51, a continuous silicon oxide blocking dielectric layer 52, a charge storage material layer 54L, and a tunneling dielectric layer 56 in a memory opening 49 constitutes a memory film 50. Each memory film 50 includes a plurality of charge storage regions comprising portions of the charge storage material layer 54L located at levels of the molybdenum layers 46 that are insulated from surrounding conductive or semiconducting materials by the continuous silicon oxide blocking dielectric layer 52 and the tunneling dielectric layer 56. In one embodiment, the first semiconductor channel layer 601, the tunneling dielectric layer 56, the charge storage material layer 54L, and the continuous silicon oxide blocking dielectric layer 52 can have vertically coincident sidewalls.

Referring to FIG. 6F, a second semiconductor channel layer 602 can be deposited directly on the semiconductor surface of the semiconductor material layer 10 and directly on the first semiconductor channel layer 601. The second semiconductor channel layer 602 can have the same material composition and the same thickness as the second semiconductor channel layer 602 in the memory opening fill structure 58 illustrated in FIG. 5M.

Figure 6G:
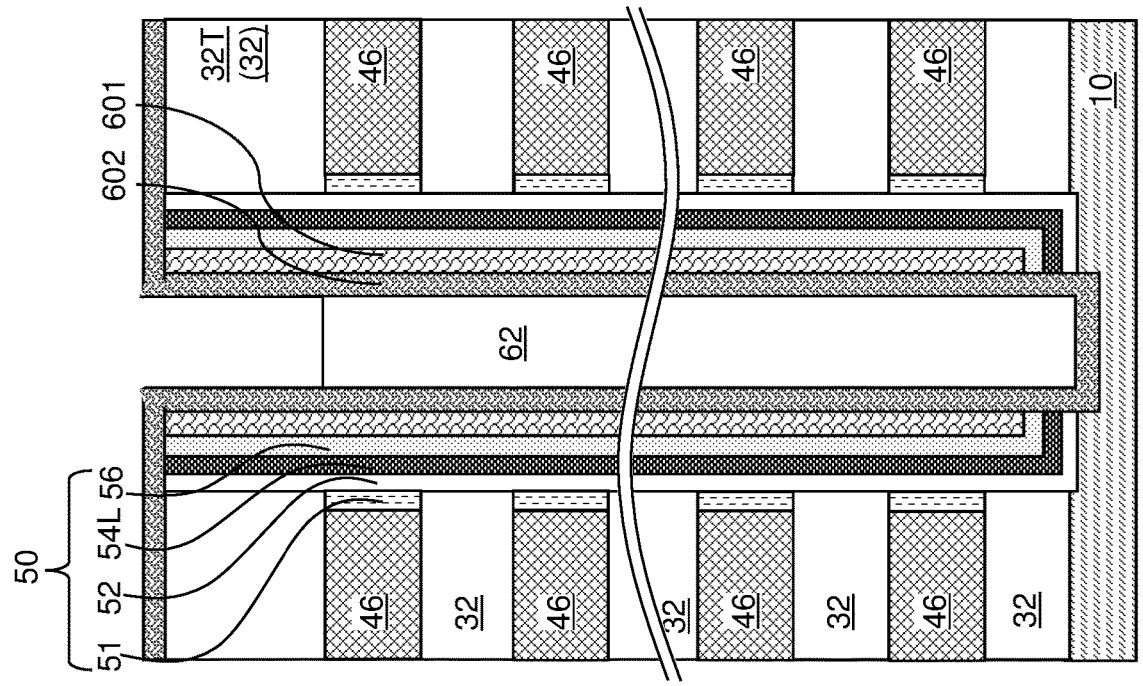

Referring to FIG. 6G, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 6H:
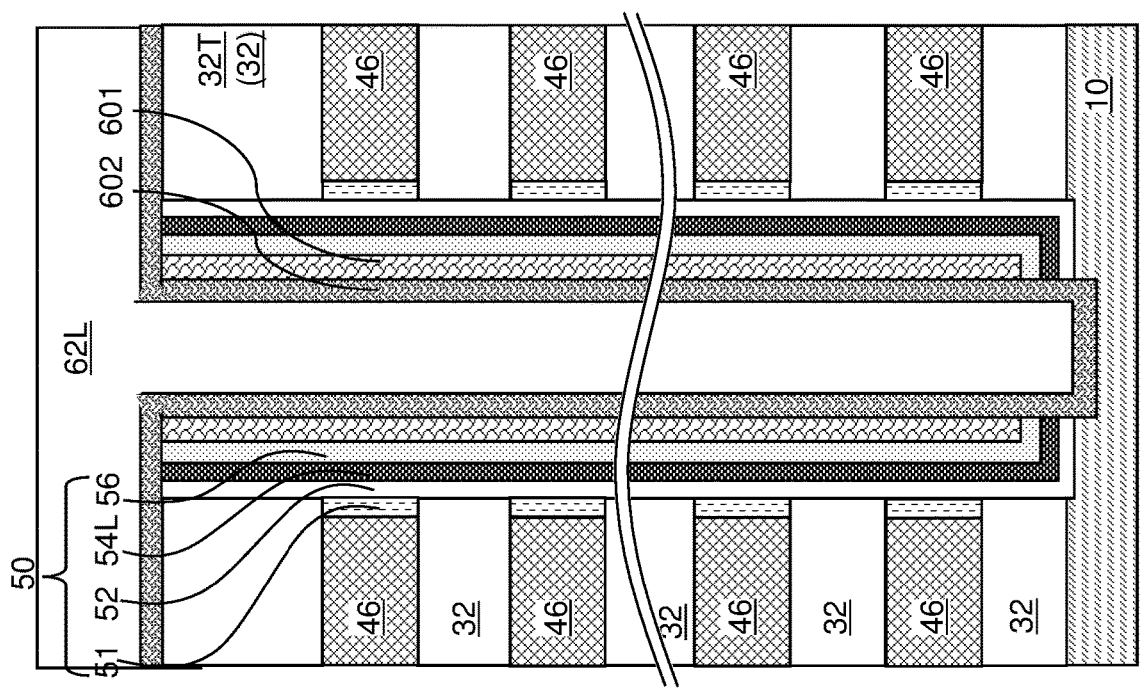

Referring to FIG. 6H, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the topmost insulating layer 32T and a second horizontal plane including the bottom surface of the topmost insulating layer 32T. Each remaining portion of the dielectric core layer 62L constitutes a dielectric core 62.

Figure 6I:
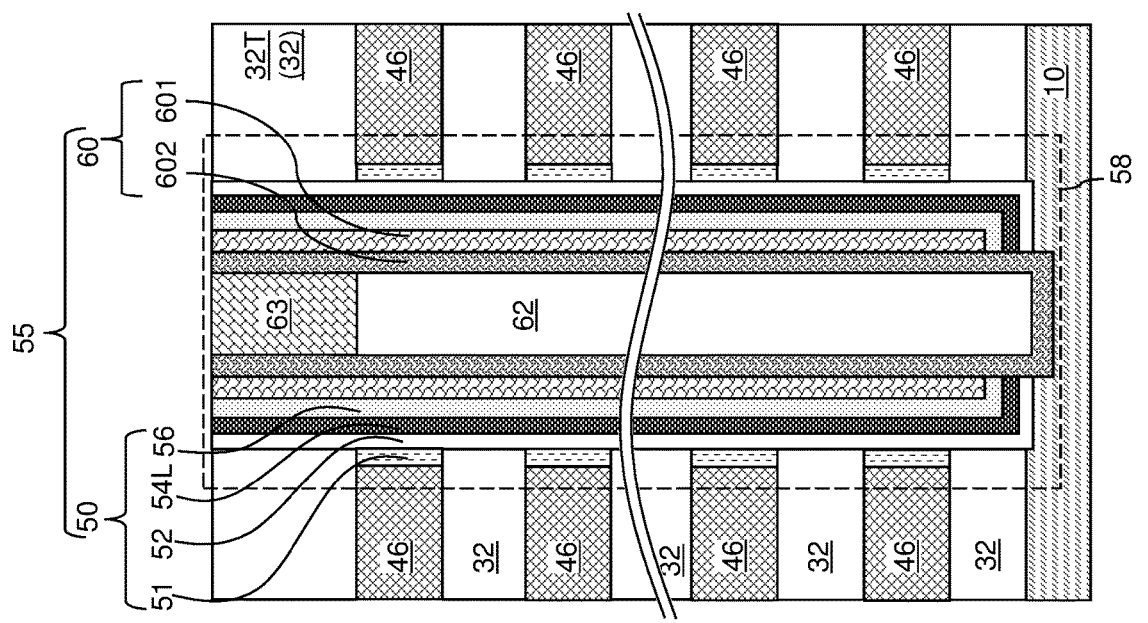

Referring to FIG. 6I, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material can be removed from above the top surface of the topmost insulating layer 32T, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the topmost insulating layer 32T can be concurrently removed by a planarization process. Each remaining portion of the second semiconductor channel layer 602 can be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. The vertical semiconductor channel 60 is formed directly on a portion of the top surface of the semiconductor material layer 10 and on the tunneling dielectric layer 56.

A tunneling dielectric layer 56 is surrounded by a vertical stack of charge storage material portions comprising portions of the charge storage material layer 54L, and laterally surrounds a portion of the vertical semiconductor channel 60. Each adjoining set of a tunneling dielectric layer 56, a charge storage material layer 54L, and a continuous silicon oxide blocking dielectric layer 52 collectively constitute a memory film 50, which includes a vertical stack of memory elements that can store a respective data bit with a macroscopic retention time.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising of the charge storage material layer 54L, a continuous silicon oxide blocking dielectric layer 52, and a vertical stack of tubular dielectric metal oxide spacers 51. Each combination of a memory stack structure 55, a dielectric core 62, and a drain region 63 within a memory opening 49 is herein referred to as a memory opening fill structure 58. Each combination of a memory film 50, a vertical semiconductor channel 60, a dielectric core 62, and a drain region 63 within each support opening 19 fills the respective support openings 19, and constitutes a support pillar structure.

The memory stack structures 55 can vertically extend through each layer in the alternating stack (32, 46). Each vertical semiconductor channel 60 contacts an inner sidewall of a memory film 50. Each memory film 50 comprises a vertical stack of tubular dielectric metal oxide spacers 51 in contact with a respective one of the molybdenum layers 46, a continuous silicon oxide blocking dielectric layer 52 contacting an inner sidewall of each of the tubular dielectric metal oxide spacers 51, a charge storage material layer 54L, and a tunneling dielectric layer 56 contacting each of the charge storage material portions 54 and the vertical semiconductor channel 60.

A plurality of memory opening fill structures 58 vertically extend through each layer within the alternating stack (32, 46). Each of the molybdenum layers 46 laterally surrounds a respective subset of the tubular dielectric metal oxide spacers 51 and directly contacts an entirety of an outer cylindrical sidewall of a respective subset of the tubular dielectric metal oxide spacers 51 located at a respective level from the substrate (9, 10).

Figure 7:
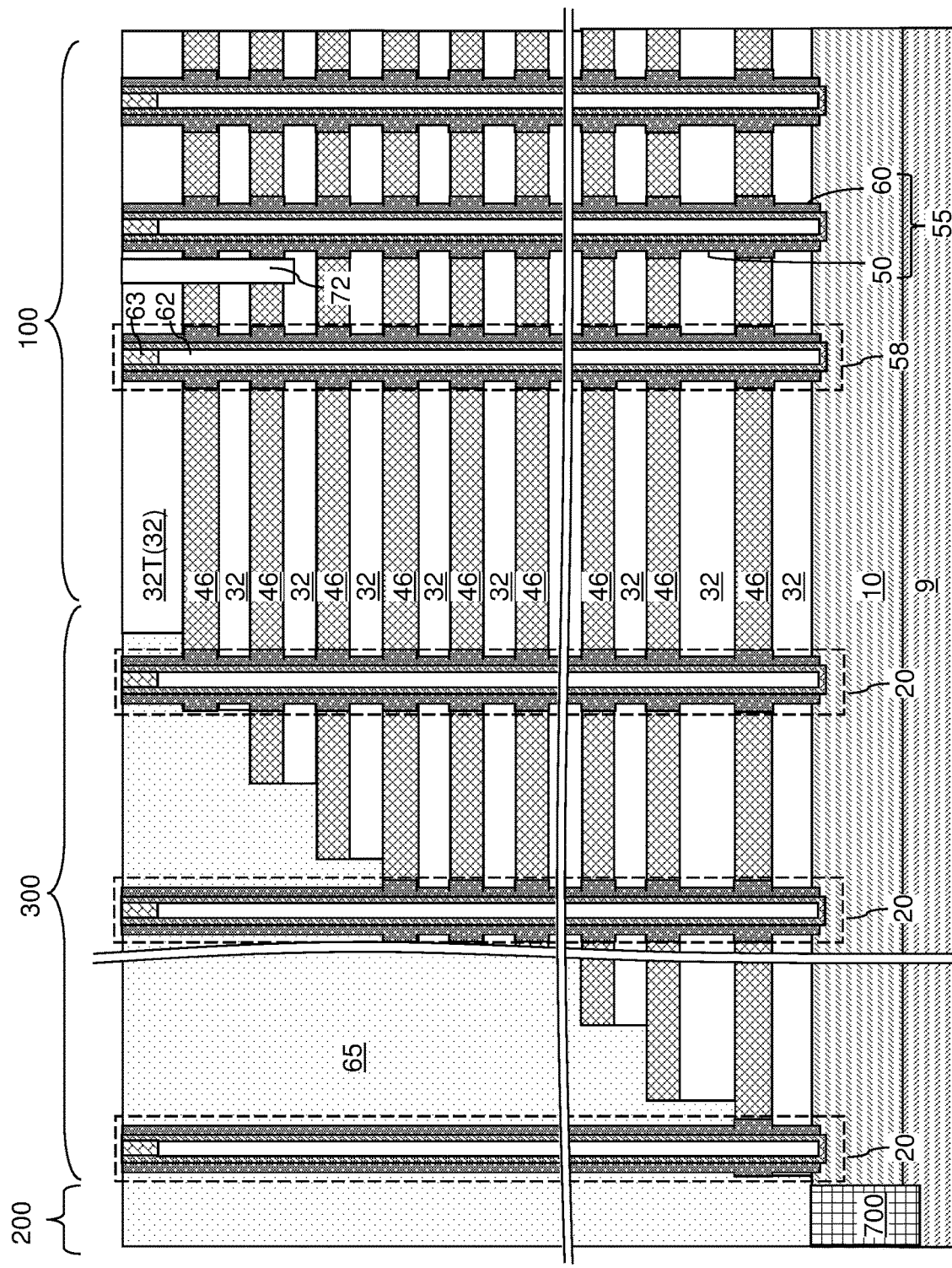
FIG. 7 is a schematic vertical cross-sectional view of the exemplary structure after formation of memory stack structures and support pillar structures according to an embodiment of the present disclosure.

Referring to FIG. 7, the exemplary structure is illustrated after formation of memory opening fill structures 58 and optional support pillar structures 20 within the memory openings 49 and the optional support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. In one embodiment, the support openings 19 and the support pillar structures 20 may be omitted.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions laterally surrounding the tunneling dielectric layer 56, and an optional continuous silicon oxide blocking dielectric layer 52. The vertical stack of charge storage regions may comprise a vertical stack of charge storage material portions 54 as in a first configuration or portions of a charge storage material layer 54L as in a second configuration.

Figure 8A:
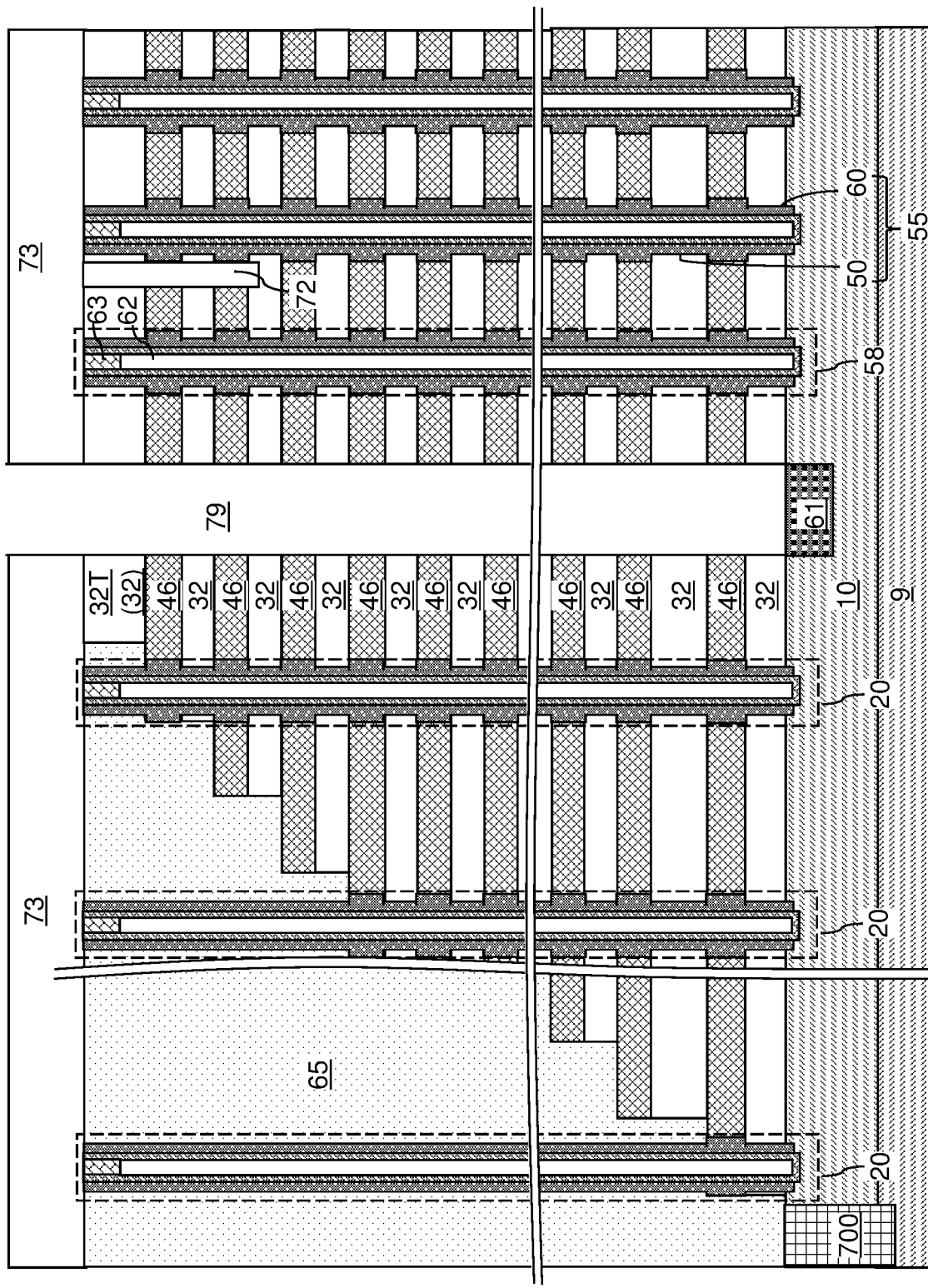
FIG. 8A is a schematic vertical cross-sectional view of the exemplary structure after formation of backside trenches according to an embodiment of the present disclosure.
Figure 8B:
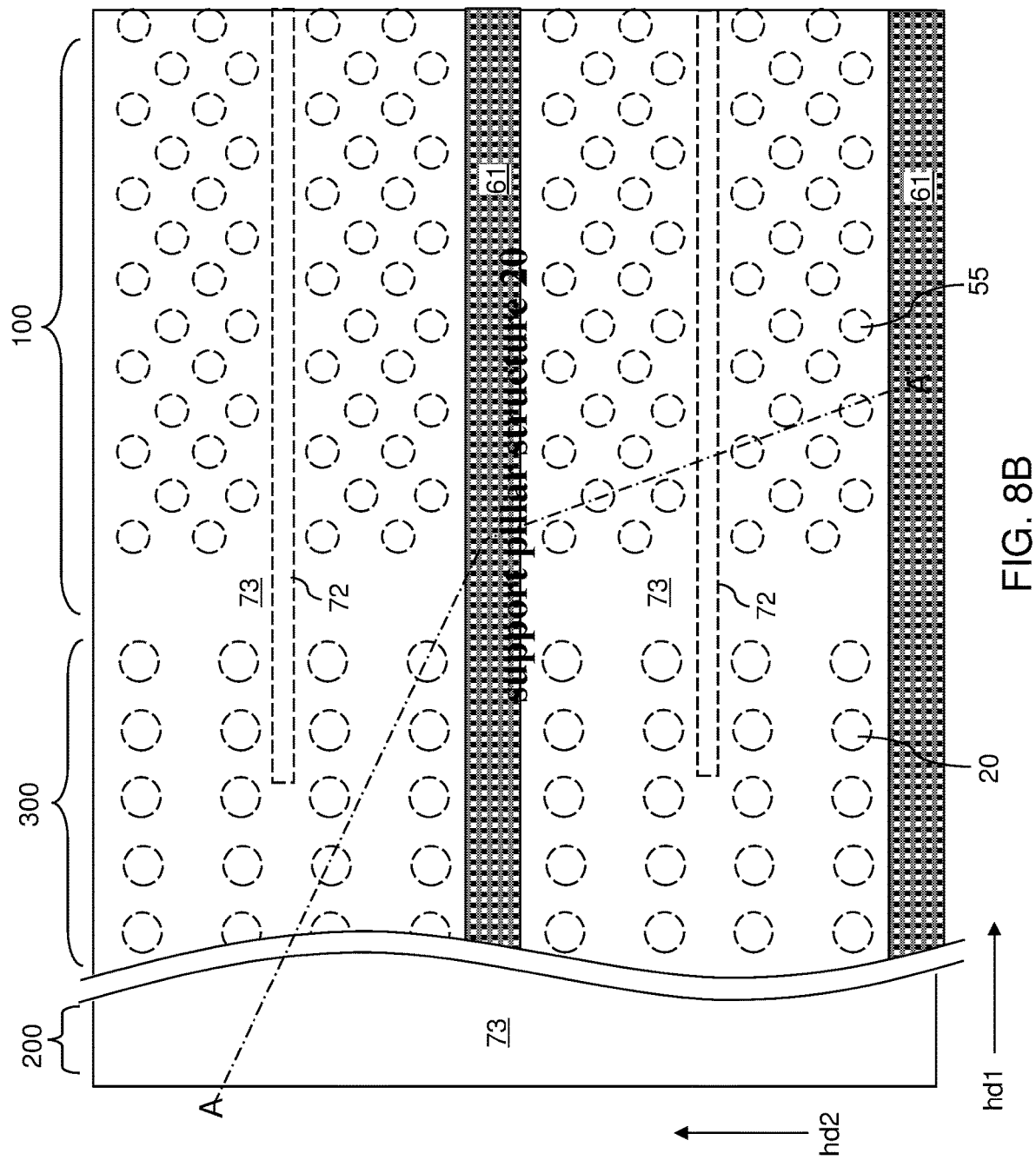
FIG. 8B is a partial see-through top-down view of the exemplary structure of FIG. 8A. The vertical plane A-A' is the plane of the schematic vertical cross-sectional view of FIG. 8A.

Referring to FIGS. 8A and 8B, a contact level dielectric layer 73 can be formed over the alternating stack (32, 46) of insulating layer 32 and molybdenum layers 46, and over the memory stack structures 55 and the support pillar structures 20. The contact level dielectric layer 73 includes a dielectric material that is different from the dielectric material of the molybdenum layers 46. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 46) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Dopants of the second conductivity type can be implanted into portions of the semiconductor material layer 10 that underlie the backside trenches 79 to form source regions 61. The atomic concentration of the dopants of the second conductivity type in the source regions 61 can be in a range from $5.0 \times 10^{18}/cm^3$ to $2.0 \times 10^{21}/cm^3$, although lesser and greater atomic concentrations can also be employed. Surface portions of the semiconductor material layer 10 that extend between each source region 61 and adjacent memory opening fill structures 58 comprise horizontal semiconductor channels 59.

Figure 8C:
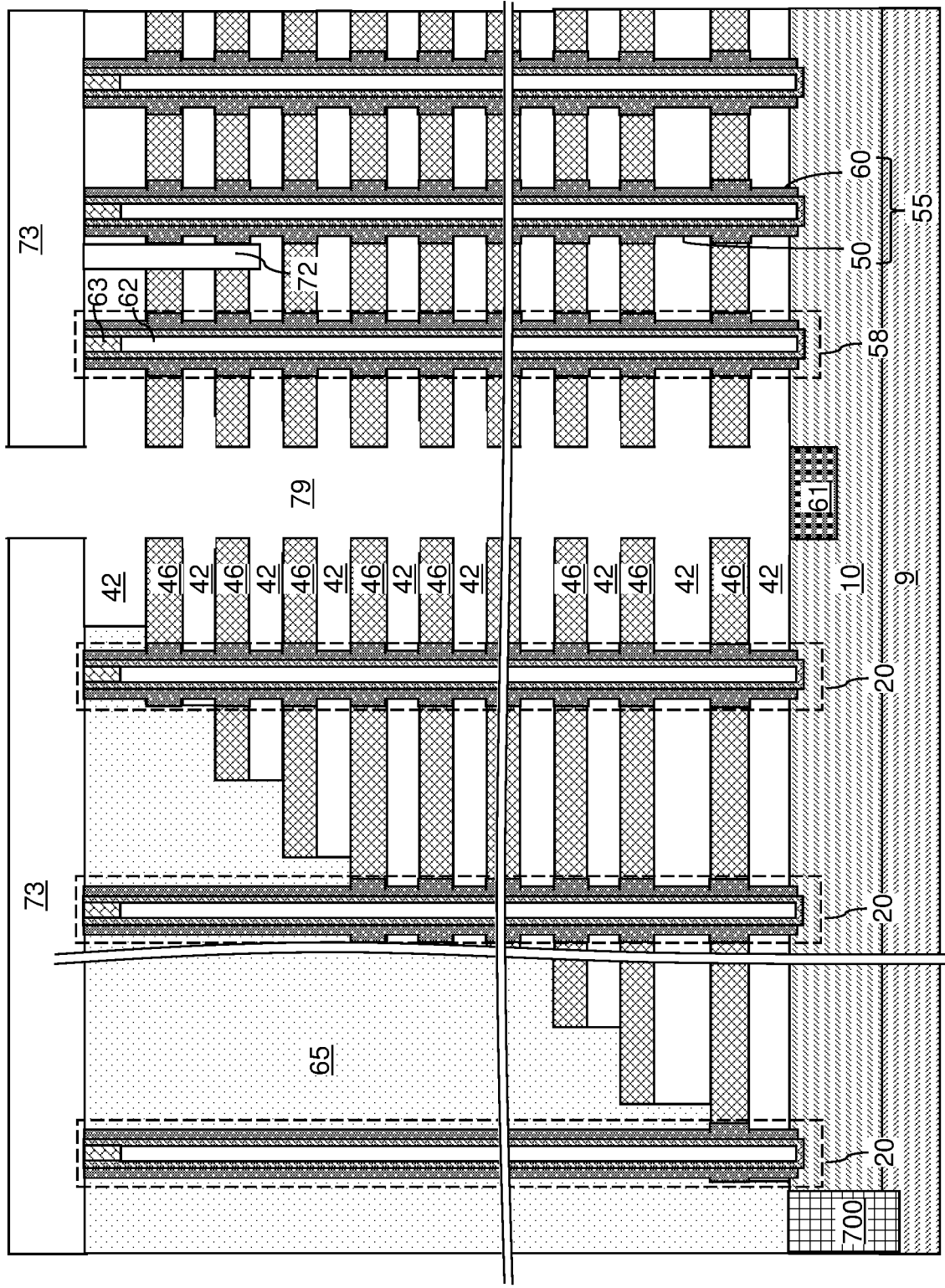
FIG. 8C is a schematic vertical cross-sectional view of an alternative embodiment of the exemplary structure after formation of backside trenches and air gaps according to an embodiment of the present disclosure.

In an optional embodiment shown in FIG. 8C, the insulating layers 32 may be selectively removed through the backside trenches 79 to leave air gaps 42 between the molybdenum layers 46. The air gaps 42 increase the isolation between the adjacent molybdenum layers 46. The insulating layers 32 may be removed using a selective etch, such as a hydrofluoric acid selective etch, which does not significantly etch the molybdenum layers 46 or the source region 61. In this embodiment, the support pillar structures 20 are utilized to prevent the molybdenum layers 46 from collapsing on each other. In other embodiments, the support pillar structures 20 may be omitted.

Figure 9A:
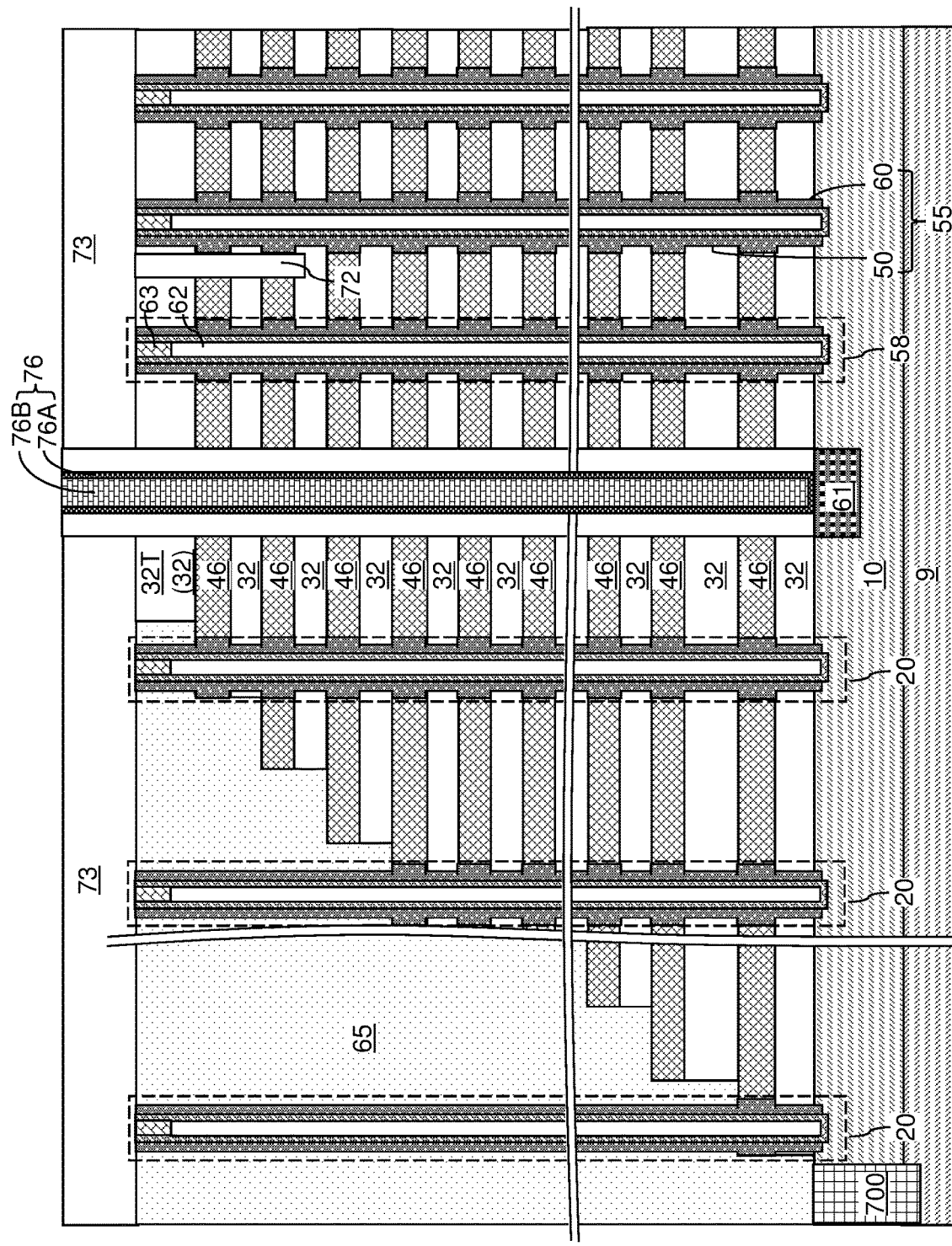
FIG. 9A is a schematic vertical cross-sectional view of the exemplary structure after formation of an insulating spacer and a backside contact structure according to an embodiment of the present disclosure.
Figure 9B:
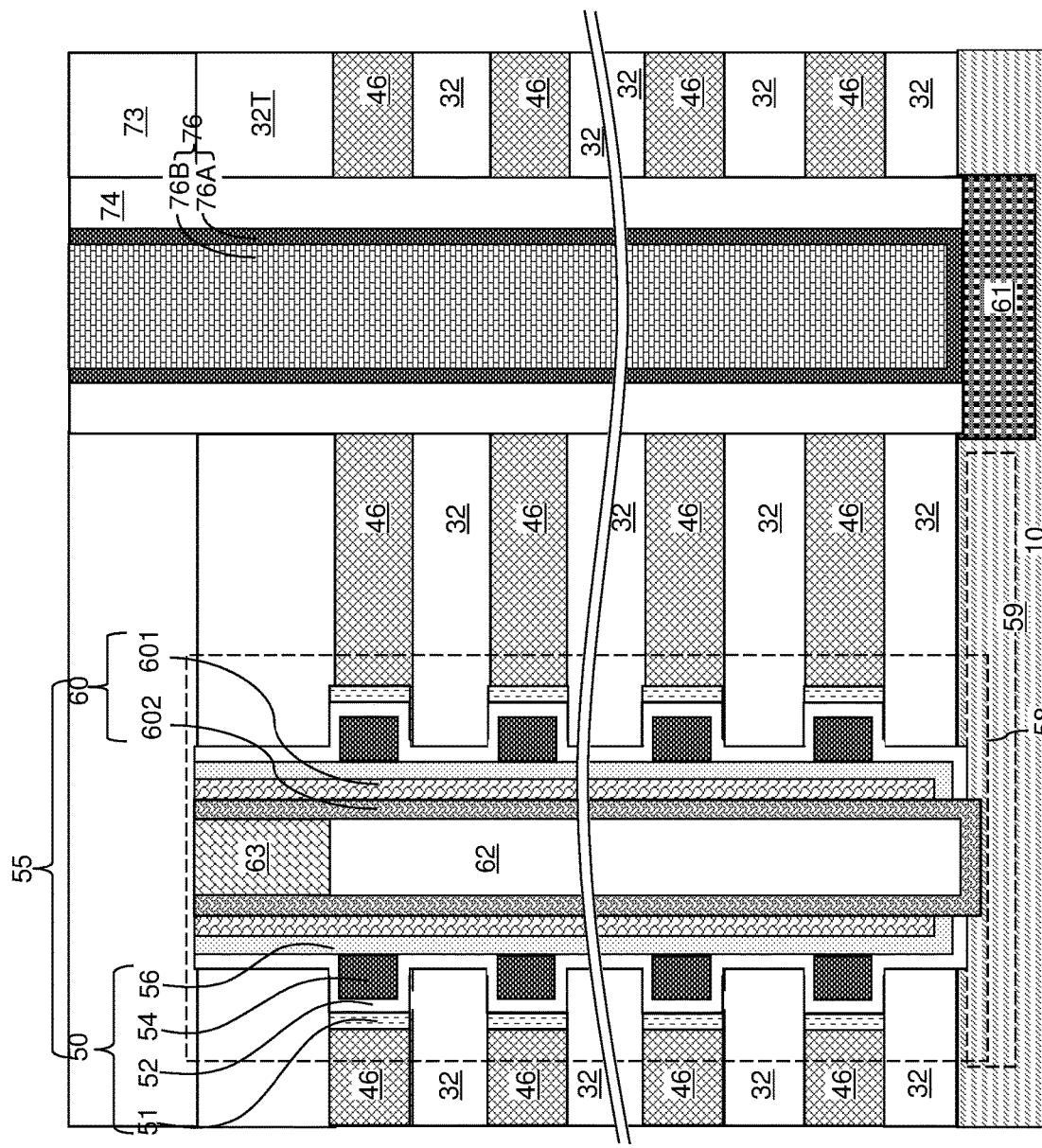
FIG. 9B is a magnified view of a region of a first configuration of the exemplary structure of FIG. 9A.
Figure 9C:
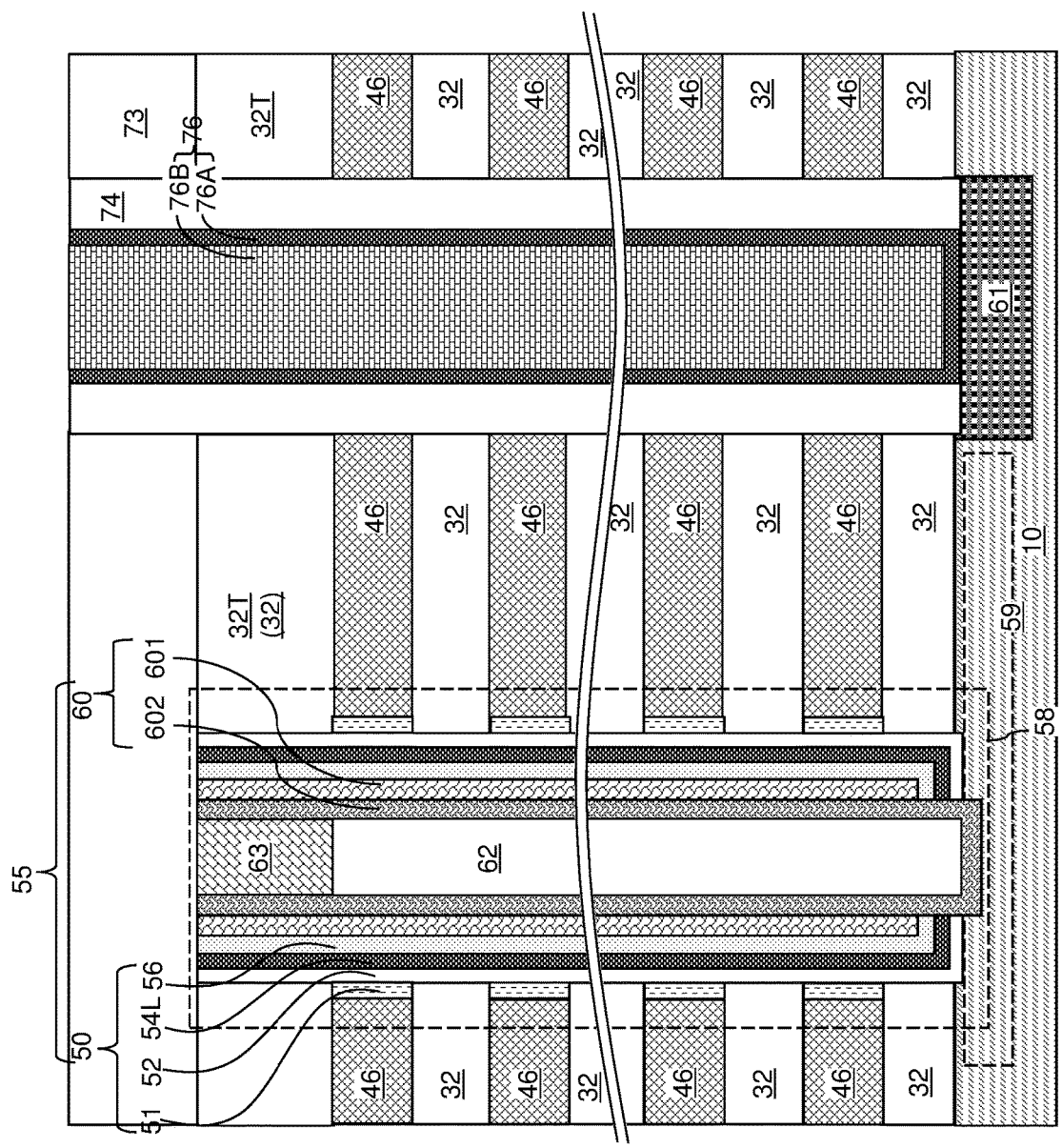
FIG. 9C is a magnified view of a region of a second configuration of the exemplary structure of FIG. 9A.

Referring to FIGS. 9A-9C, an insulating spacer 74 and a backside contact via structure 76 can be formed in each backside trench 79. FIG. 9B illustrates a region of the exemplary structure in case the first configuration of the memory opening fill structure 58 illustrated in FIG. 5M is employed in the exemplary structure. FIG. 9C illustrates a region of the exemplary structure in case the second configuration of the memory opening fill structure 58 illustrated in FIG. 6I is employed in the exemplary structure.

An insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

An upper portion of the semiconductor material layer 10 that extends between the source region 61 and the vertical semiconductor channels 60 constitutes a horizontal semiconductor channel 59 for a plurality of field effect transistors. The horizontal semiconductor channel 59 is electrically connected to multiple vertical semiconductor channels 60. In an alternative embodiment, an optional pedestal channel portion (e.g., an epitaxial pedestal) can be formed at the bottom portion of each memory opening 49 and each support openings 19, for example, by selective epitaxy at the steps shown in FIGS. 5A and 6A. Each pedestal channel portion comprises a single crystalline semiconductor material (e.g., single crystal silicon) in epitaxial alignment with the single crystalline semiconductor material of the semiconductor material layer 10. Each pedestal channel portion may comprise part of the semiconductor channel (59, 60) which electrically connects to the horizontal semiconductor channel 59 to multiple vertical semiconductor channels 60. Alternatively, the pedestal channel portion may be omitted and the horizontal semiconductor channel 59 is directly physically connected to multiple vertical semiconductor channels 60. Each source region 61 is formed in an upper portion of the substrate (9, 10). Semiconductor channels (59, 60) extend between each source region 61 and a respective set of drain regions 63. The semiconductor channels (59, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. Each combination of an insulating spacer 74 and a backside contact via structure 76 formed in a backside trench 79 constitutes a backside trench fill structure (74, 76).

Figure 9D:
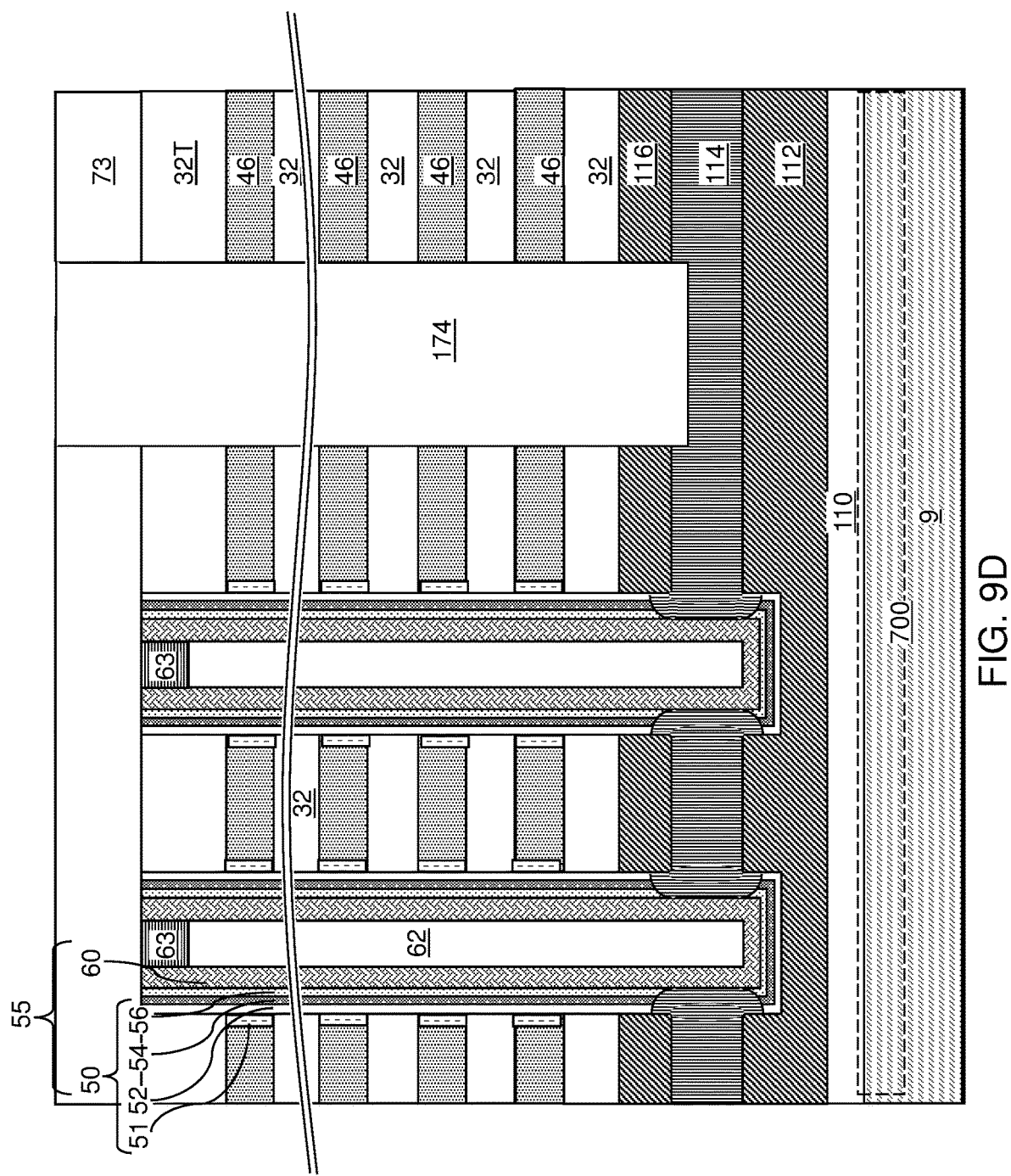
FIG. 9D is a magnified view of a region of an alternative configuration of the exemplary structure of FIG. 9A.

In an alternative embodiment shown in FIG. 9D, the backside contact via structure 76 may be omitted, and the entirety of each backside trench 79 may be filled with a respective dielectric material portion 174. In this alternative embodiment, the source region 61 may also be omitted and a horizontal source line 114 may be formed in contact with a sidewall of a lower portion of the semiconductor channel 60. The horizontal source line 114 may comprise a doped semiconductor layer of the second conductivity type, such as an n-type polysilicon layer. If desired, additional doped semiconductor layers (112, 116) of the second conductivity type may be located below and/or above the horizontal source line 114. The combination of the doped semiconductor layers (112, 114, 116) forms a direct strap contact to the semiconductor channel 60. This alternative embodiment may be used with a CMOS under array configuration, where the driver circuit (e.g., at least one semiconductor device 700) is located under the memory array region 100. The driver circuit 700 on the substrate 9 is separated from the alternating stack (32, 46) by an insulating layer 110. In another alternative embodiment, the driver circuit 700 may be located on a different substrate which is bonded over the memory array region 100 in a CMOS bonded to array configuration.

Each backside trench fill structure (74, 76) can be formed on sidewalls of an alternating stack (32, 46), and may contact sidewalls of two alternating stacks (32, 46). An alternating stack of insulating layers 32 and molybdenum layers 46 is formed over the semiconductor material layer 10 between each neighboring pair of backside trench fill structures (74, 76). Each of the neighboring pair of backside trench fill structures (74, 76) comprises a dielectric material portion (such as an insulating spacer 74) in contact with each layer within the alternating stack (32, 46) that is located between the neighboring pair of backside trench fill structures (74, 76). The alternating stack (32, 46) embeds a plurality of memory opening fill structures 58, which may be arranged as a two-dimensional periodic array of memory opening fill structures 58. Each of the molybdenum layers 46 within the alternating stack (32, 46) can continuously extend from tubular dielectric metal oxide spacers 51 within the memory opening fill structures 58 to each of the dielectric material portions (such as the insulating spacers 74) of the pair of backside trench fill structures (74, 76). In one embodiment, each of the molybdenum layers 46 within the alternating stack (32, 46) laterally surrounds a respective subset of the tubular dielectric metal oxide spacers 51 of the memory opening fill structures 58, and directly contacts an entirety of an outer cylindrical sidewall of the respective subset of the tubular dielectric metal oxide spacers 51.

In an alternative embodiment, the backside trenches 79 and the backside trench fill structure (74, 76) may be omitted and a discrete electrical contact to the source region 61 may be made through the substrate (9, 10) or in regions 200 or 300. The omission of the backside trenches 79 increases the device density.

Figure 10A:
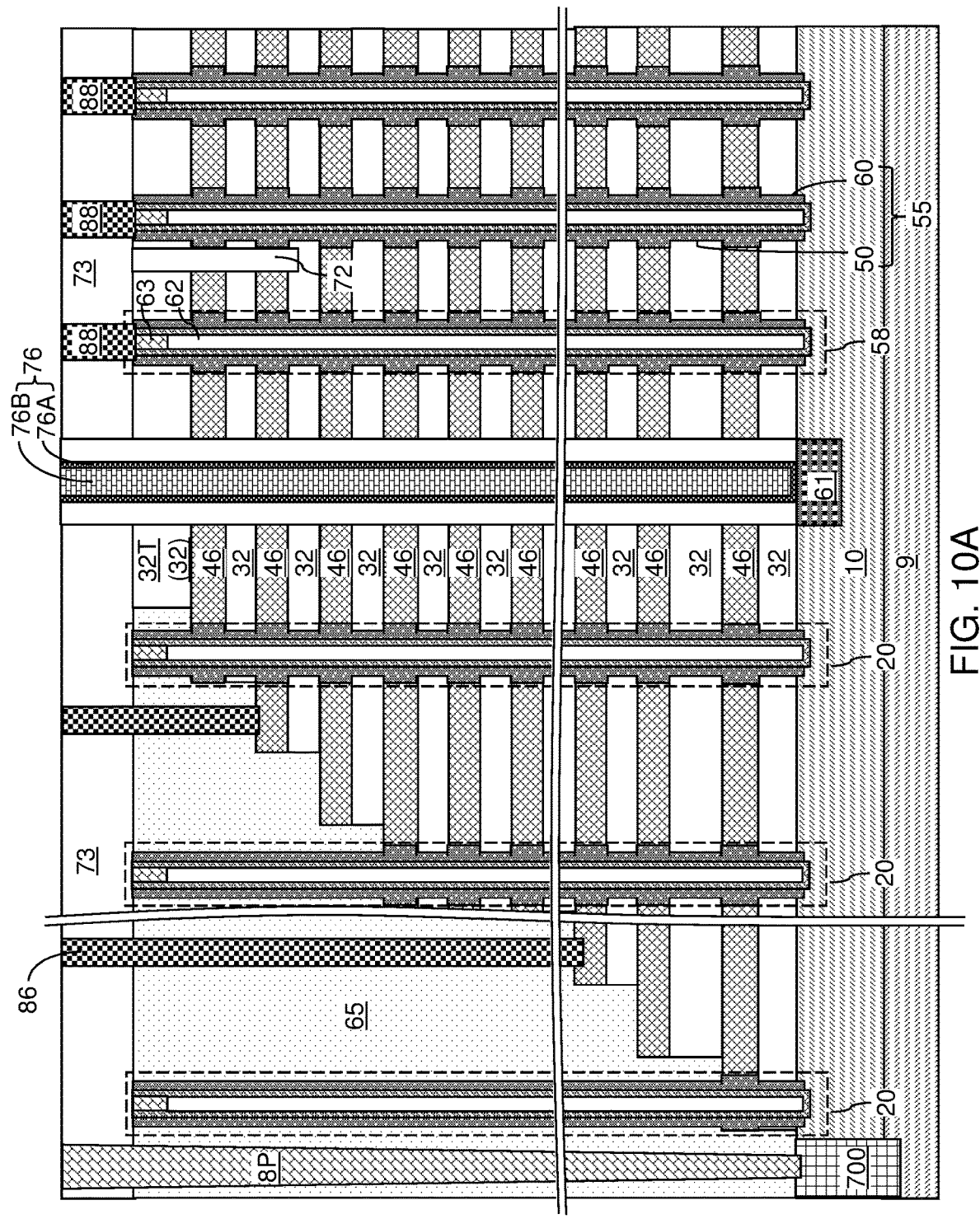
FIG. 10A is a schematic vertical cross-sectional view of the exemplary structure after formation of additional contact via structures according to an embodiment of the present disclosure.
Figure 10B:
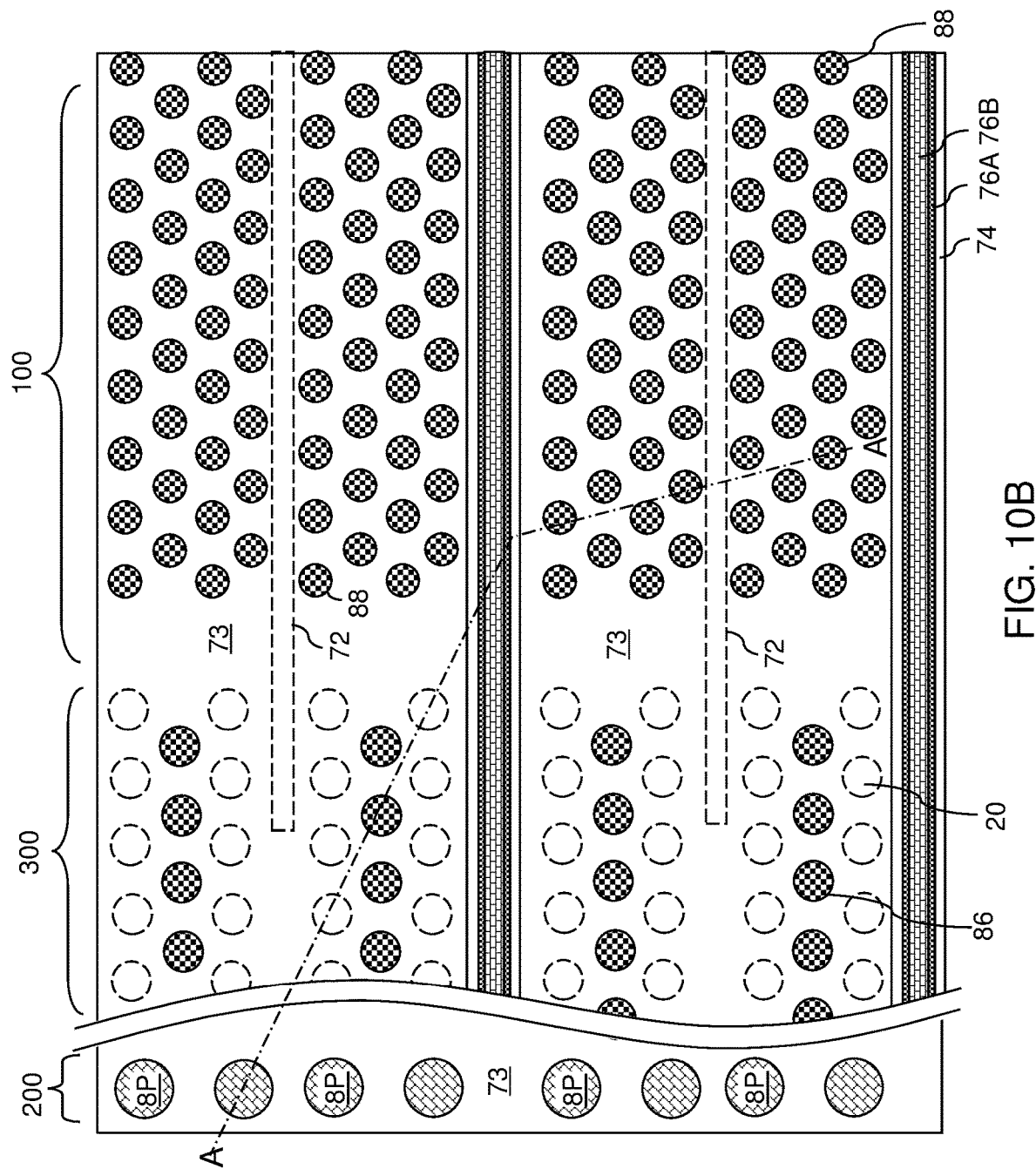
FIG. 10B is a top-down view of the exemplary structure of FIG. 10A. The vertical plane A-A' is the plane of the schematic vertical cross-sectional view of FIG. 10A.

Referring to FIGS. 10A and 10B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the molybdenum layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices. The word line contact via structures 86 are contact via structures that are formed through the retro-stepped dielectric material portion 65 directly on a top surface of a respective one of the molybdenum layers 46. While one tier alternating stack (32, 46) is illustrated, it should be noted that plural tiers of alternating stacks (32, 46) may be formed.

Referring to all drawings and according to various embodiments of the present disclosure, a three-dimensional memory device is provided, which comprises an alternating stack of insulating layers 32 and word lines consisting essentially of molybdenum layers 46 located over a substrate (9, 10); and memory stack structures 55 extending through each layer in the alternating stack (32, 46), wherein: each of the memory stack structures 55 comprises a memory film 50 and a vertical semiconductor channel 60 contacting an inner sidewall of the memory film 50; and each memory film 50 comprises a vertical stack of discrete tubular dielectric metal oxide spacers 51 in contact with a respective one of the molybdenum layers 46, a continuous silicon oxide blocking dielectric layer 52 contacting an inner sidewall of each of the tubular dielectric metal oxide spacers 51, a vertical stack of charge storage material portions (comprising charge storage material portions 54 or portions of a charge storage material layer 54L), and a tunneling dielectric layer 56 contacting each of the charge storage material portions and the vertical semiconductor channel 60.

In one embodiment, the continuous silicon oxide blocking dielectric layer 52 continuously extends through each layer in the alternating stack (32, 46) and directly contacts each insulating layer 32 in the alternating stack (32, 46). In one embodiment, the continuous silicon oxide blocking dielectric layer 52 has a laterally undulating vertical cross-sectional profile in which first tubular segments located at levels of the molybdenum layers are laterally offset outward with respect to second tubular segments located at levels of the insulating layers 32. In one embodiment, the first tubular segments are connected to second tubular segments by planar annular segments of the continuous silicon oxide blocking dielectric layer 52 that contact a respective horizontal surface of the insulating layers 32.

In one embodiment, the planar annular segments of the continuous silicon oxide blocking dielectric layer 52 contact the respective horizontal surface of the insulating layers 32 at annular horizontal surfaces; each of the annular horizontal surfaces comprises an inner periphery and an outer periphery that is laterally spaced from the inner periphery by a uniform spacing 53; and each of the annular horizontal surfaces is coplanar with a respective horizontal interface between a respective one of the insulating layers 32 and a respective one of the molybdenum layers 46.

In one embodiment, each tubular dielectric metal oxide spacer 51 within the vertical stack of tubular dielectric metal oxide spacers 51 contacts a cylindrical sidewall of, and has a same height as, a respective one of the molybdenum layers 46. In one embodiment, each charge storage material portion 54 within the vertical stack of charge storage material portions 54 comprises a discrete portion located at the levels of the word lines and which is laterally spaced from a respective one of the tubular dielectric metal oxide spacers 51 by the continuous silicon oxide blocking dielectric layer 52, and has a height that is less than a height of the respective one of the tubular dielectric metal oxide spacers 51 by twice a thickness of the continuous silicon oxide blocking dielectric layer 52.

In one embodiment, an outer sidewall of the tunneling dielectric layer 56 contacts inner sidewalls of tubular segments of the continuous silicon oxide blocking dielectric layer 52 at each level of the insulating layers 32. In one embodiment, the outer sidewall of the tunneling dielectric layer 56 extends straight without any lateral step from a topmost layer of the alternating stack (32, 46) to a bottommost layer of the alternating stack (32, 46). In one embodiment, the continuous silicon oxide blocking dielectric layer 52 contacts an annular top surface of a semiconductor material layer 10 that underlies the alternating stack (32, 46) and located in the substrate (9, 10).

In one embodiment, the vertical stack of charge storage material portions comprises a single continuous cylindrical charge storage material layer 54L that vertically extends through each of the molybdenum layers 46 within the alternating stack (32, 46), and is laterally spaced from the tubular dielectric metal oxide spacers 51 by the continuous silicon oxide blocking dielectric layer 52.

In the embodiment shown in FIG. 9D, a horizontal source line 114 contacts a sidewall of a bottom portion of the vertical semiconductor channel 60. In one embodiment, the discrete tubular dielectric metal oxide spacers 51 comprise aluminum oxide spacers, and each word line consists of only the molybdenum layers 46 lacks a metal nitride barrier layer (e.g., TiN, WN or TaN) or metal (e.g., W, Ti, Ru, etc.) other than molybdenum. In one embodiment, each of the molybdenum layers 46 laterally surrounds the respective one of the tubular dielectric metal oxide spacers 51 and directly contacts an entirety of an outer cylindrical sidewall of the respective one of the tubular dielectric metal oxide spacers 51.

The exemplary structures can include a three-dimensional memory device. In one embodiment, the three-dimensional memory device comprises a monolithic three-dimensional NAND memory device. The molybdenum layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a charge storage material portion 54 at a level of an molybdenum layer 46) in a first device level of the array of monolithic three-dimensional NAND strings can be located over another memory cell (comprising another charge storage material portion 54 at a level of another molybdenum layer 46) in a second device level of the array of monolithic three-dimensional NAND strings. The silicon substrate can contain an integrated circuit comprising a driver circuit (comprising subset of the least one semiconductor device 700) for the memory device located thereon. The molybdenum layers 46 can comprise a plurality of word lines/control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 60), wherein at least one end portion (such as a vertical semiconductor channel 60) of each of the plurality of semiconductor channels (59, 60) extends substantially perpendicular to a top surface of the substrate (9, 10) and comprising a respective one of the vertical semiconductor channels 60; and a plurality of charge storage elements (comprising portions of the memory films 50, i.e., the charge storage material portions 54). Each charge storage element can be located adjacent to a respective one of the plurality of semiconductor channels (59, 60).

The molybdenum layers 46 can provide high electrical conductivity that is comparable to the electrical conductivity of tungsten in a thickness range of about 20 nm to less, thereby reducing the RC delay of signals in the word lines to improve vertical scaling of the three-dimensional array of memory device. Further, formation of the vertical stack of tubular dielectric metal oxide spacers 51 is a self-aligned process that ensures that the tubular dielectric metal oxide spacers 51 are formed within annular recesses 43 around each memory opening 49. The height of each tubular dielectric metal oxide spacer 51 can be identical to the height of a respective molybdenum layer 46 that a respective tubular dielectric metal oxide spacer 51 contacts. Thus, vertical scaling of the tubular dielectric metal oxide spacers 51 automatically occurs with vertical scaling of the molybdenum layers 46. In some embodiments, the charge storage material portions 54 can be formed as discrete structures, thereby eliminating charge leakage across adjoining levels of molybdenum layers 46. The various embodiments of the present disclosure also simplify the manufacturing process by elimination of a replacement process in which sacrificial material layers within an alternating stack are replaced with electrically conductive word line layers, such as tungsten layers.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and word lines consisting essentially of molybdenum layers located over a substrate; and
memory stack structures extending through each layer in the alternating stack, wherein:
each of the memory stack structures comprises a memory film and a vertical semiconductor channel contacting an inner sidewall of the memory film; and
each memory film comprises a vertical stack of discrete tubular dielectric metal oxide spacers in contact with a respective one of the molybdenum layers, a continuous silicon oxide blocking dielectric layer contacting an inner sidewall of each of the tubular dielectric metal oxide spacers, a vertical stack of charge storage material portions, and a tunneling dielectric layer contacting each of the charge storage material portions and the vertical semiconductor channel.

2. The three-dimensional memory device of claim 1, wherein the continuous silicon oxide blocking dielectric layer continuously extends through each layer in the alternating stack and directly contacts each insulating layer in the alternating stack.

3. The three-dimensional memory device of claim 2, wherein the continuous silicon oxide blocking dielectric layer has a laterally undulating vertical cross-sectional profile in which first tubular segments located at levels of the molybdenum layers are laterally offset outward with respect to second tubular segments located at levels of the insulating layers.

4. The three-dimensional memory device of claim 3, wherein the first tubular segments are connected to second tubular segments by planar annular segments of the continuous silicon oxide blocking dielectric layer that contact a respective horizontal surface of the insulating layers.

5. The three-dimensional memory device of claim 4, wherein:
the planar annular segments of the continuous silicon oxide blocking dielectric layer contact the respective horizontal surface of the insulating layers at annular horizontal surfaces;
each of the annular horizontal surfaces comprises an inner periphery and an outer periphery that is laterally spaced from the inner periphery by a uniform spacing; and
each of the annular horizontal surfaces is coplanar with a respective horizontal interface between a respective one of the insulating layers and a respective one of the molybdenum layers.

6. The three-dimensional memory device of claim 1, wherein each tubular dielectric metal oxide spacer within the vertical stack of tubular dielectric metal oxide spacers contacts a cylindrical sidewall of, and has a same height as, a respective one of the molybdenum layers.

7. The three-dimensional memory device of claim 6, wherein each charge storage material portion within the vertical stack of charge storage material portions comprises a discrete portion located at levels of the words lines and which is laterally spaced from a respective one of the tubular dielectric metal oxide spacers by the continuous silicon oxide blocking dielectric layer, and has a height that is less than a height of the respective one of the tubular dielectric metal oxide spacers by twice a thickness of the continuous silicon oxide blocking dielectric layer.

8. The three-dimensional memory device of claim 7, wherein:
an outer sidewall of the tunneling dielectric layer contacts inner sidewalls of tubular segments of the continuous silicon oxide blocking dielectric layer at each level of the insulating layers; and
the outer sidewall of the tunneling dielectric layer extends straight without any lateral step from a topmost layer of the alternating stack to a bottommost layer of the alternating stack.

9. The three-dimensional memory device of claim 1, wherein the vertical stack of charge storage material portions comprises a single continuous cylindrical charge storage material layer that vertically extends through each of the molybdenum layers within the alternating stack, and is laterally spaced from the tubular dielectric metal oxide spacers by the continuous silicon oxide blocking dielectric layer.

10. The three-dimensional memory device of claim 1, further comprising a horizontal source line which contacts a sidewall of a bottom portion of the vertical semiconductor channel.

11. The three-dimensional memory device of claim 1, wherein the discrete tubular dielectric metal oxide spacers comprise aluminum oxide spacers.

12. The three-dimensional memory device of claim 1, wherein each word line lacks a metal nitride barrier layer or metal other than molybdenum.

13. The three-dimensional memory device of claim 1, wherein each of the molybdenum layers laterally surrounds the respective one of the tubular dielectric metal oxide spacers and directly contacts an entirety of an outer cylindrical sidewall of the respective one of the tubular dielectric metal oxide spacers.

* * * * *